(12) United States Patent
Petre et al.

(10) Patent No.: US 7,324,036 B2
(45) Date of Patent: Jan. 29, 2008

(54) ADAPTIVE, INTELLIGENT TRANSFORM-BASED ANALOG TO INFORMATION CONVERTER METHOD AND SYSTEM

(75) Inventors: Peter Petre, Agoura, CA (US); Shubha Kadambo, Thousand Oaks, CA (US); Joseph F. Jensen, Camarillo, CA (US)

(73) Assignee: HRL Laboratories, LLC, Malibu, CA (US)

( * ) Notice: Subject to any disclaimer, the term of this patent is extended or adjusted under 35 U.S.C. 154(b) by 153 days.

(21) Appl. No.: 10/845,487

(22) Filed: May 12, 2004

(65) Prior Publication Data
US 2005/0156775 A1    Jul. 21, 2005

Related U.S. Application Data

(60) Provisional application No. 60/469,656, filed on May 12, 2003.

(51) Int. Cl.
*H03M 1/00* (2006.01)
(52) U.S. Cl. .................. 341/155; 341/110; 341/143
(58) Field of Classification Search .......... 341/110, 341/126, 143, 155; 342/195
See application file for complete search history.

(56) References Cited

U.S. PATENT DOCUMENTS

| | | | |
|---|---|---|---|
| 5,495,554 A * | 2/1996 | Edwards et al. | 704/205 |
| 5,568,142 A * | 10/1996 | Velazquez et al. | 341/126 |
| 6,339,390 B1 * | 1/2002 | Velazquez et al. | 341/120 |
| 6,362,760 B2 * | 3/2002 | Kober et al. | 341/141 |
| 6,518,908 B2 * | 2/2003 | Boehm et al. | 341/155 |
| 6,701,297 B2 * | 3/2004 | Main | 704/500 |

OTHER PUBLICATIONS

M. Unser, "Sampling-50 years after Shannon," Proceedings of the IEEE, vol. 88, Issue 4, Apr. 2000, pp. 569-587.

M. Kamada, "A smooth signal generator based on quadratic B-spline functions," Signal Processing, IEEE Transactions on, vol. 43, Issue 5, May 1995, pp. 1252-1255.

G. Walter, "A sampling theorem for wavelet subspaces," Information Theory, IEEE Transactions on, vol. 38, Issue 2, Part 2, Mar. 1992, pp. 881-884.

C. Herley, "Wavelets and recursive filter banks," signal Processing, IEEE Transactions on, vol. 41, Issue 8, Aug. 1993, pp. 2536-2556.

Z. Xiong, "Flexible tree-structured signal expansions using time-varying wavelet packets," Signal Processing, IEEE Transactions on, vol. 45, Issue 2, Feb. 1997, pp. 333-345.

(Continued)

*Primary Examiner*—Howard L. Williams
(74) *Attorney, Agent, or Firm*—Tope-Mckay & Associates

(57) ABSTRACT

The present invention provides an adaptive, intelligent transform based Analog to Information Converter (AIC) for wideband signals by directly converting an analog signal to information (e.g., features, decisions). This direct conversion is achieved by (i) capturing most of the information of a wideband signal via hardware/software implemented mathematical transformations, (ii) effectively removing unwanted signals such as jammer and interfere from the input signal, and (iii) using novel algorithms for highly accurate decision making and feature extraction (e.g., high probability of detection with low probability of false alarm). The jump in the improvement over today's state-of-the-art is in terms of effective and optimum signal information extraction at high-speed.

30 Claims, 19 Drawing Sheets

OTHER PUBLICATIONS

A. Averbuch, "Biorthogonal Butterworth wavelets derived from discrete interpolatory splines," Signal Processing, IEEE Transactions on, vol. 49, Issue 11, Nov. 2001, pp. 2682-2692.

E. King, "A Nyquist-rate delta-sigma A/D converter," Solid-State Circuits, IEEE Journal of, vol. 33, Issue 1, Jan. 1998, pp. 45-52.

P. Lowenborg, "Analysis of gain and time-skew errors in filter bank based A/D converters," Circuits and Systems, 2001. MWSCAS 2001. Proceeding of the 44th IEEE 2001 Midwest symposium on, vol. 1, 2001, pp. 263-266, no month.

Q. Jiang and S. Kadambe, "Target enhancement using steerable pyramid decomposition and multi-channel filtering," in Proc. Of 35th Asilomar conference on Signals, systems and computers, Asilomar grounds, Pacific Grove, CA, Nov. 4-7, 2001.

S. Kadambe and Y. Owechko, "Computation reduction in space time adaptive processing (STAP) of Radar signals using orthogonal wavelet decompositions," Proc. Of 34th Asilomar Conference on Signals, Systems & Computers, Pacific Grove, CA, Oct. 30 to Nov. 1, 2000.

* cited by examiner

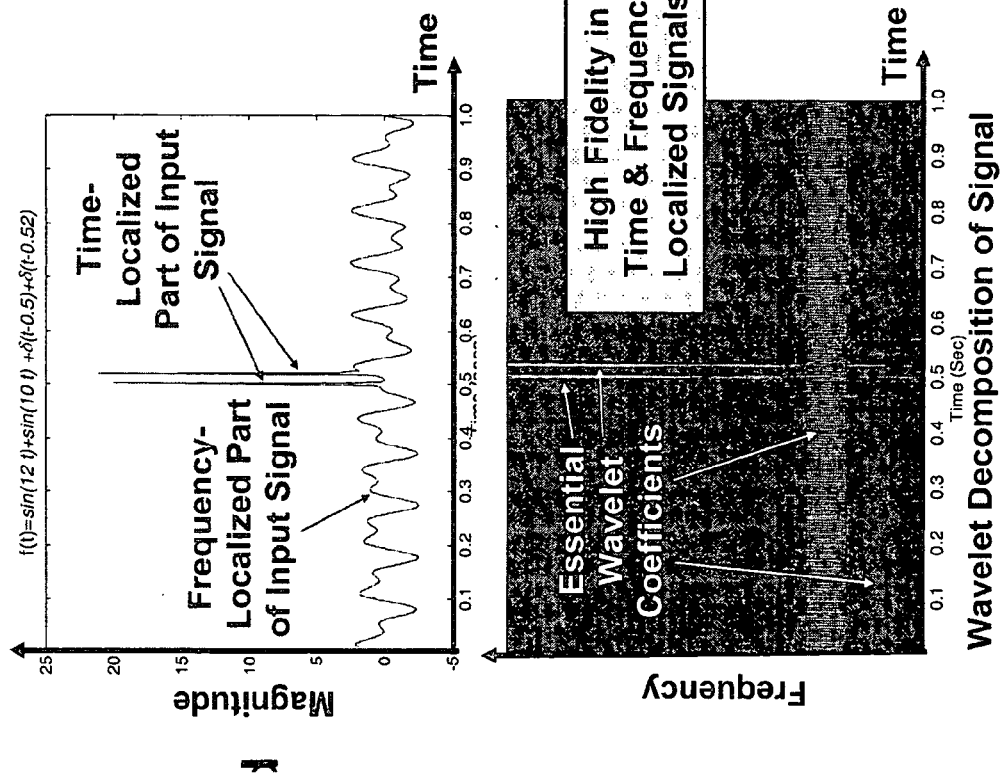

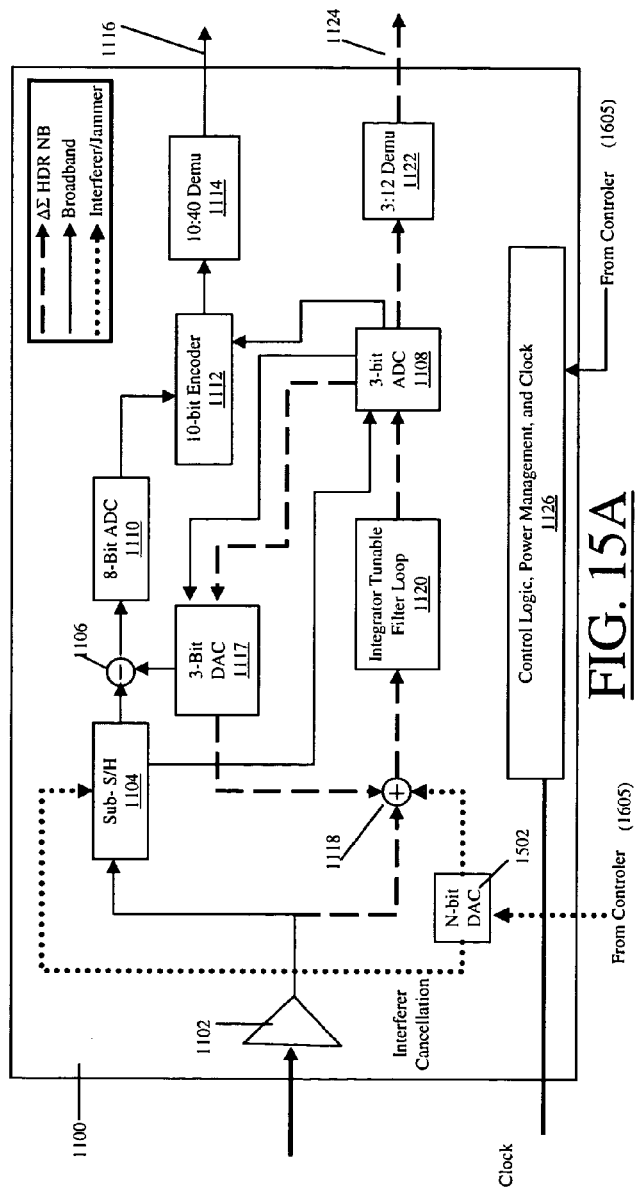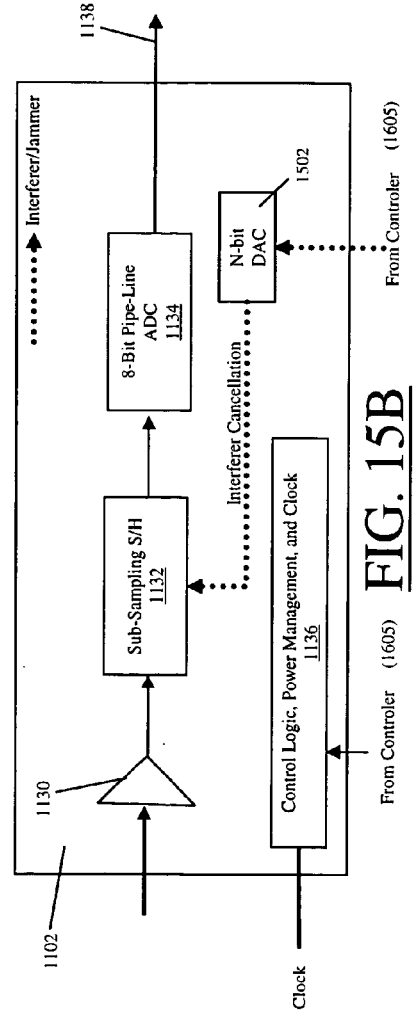
FIG. 15A
FIG. 15B

ADAPTIVE, INTELLIGENT TRANSFORM-BASED ANALOG TO INFORMATION CONVERTER METHOD AND SYSTEM

CROSS-REFERENCE TO RELATED APPLICATION

This application claims the benefit of priority to provisional application No. 60/469,656, filed in the United States on May 12, 2003, and titled ADAPTIVE, INTELLIGENT, TRANSFORM-BASED, ANALOG TO INFORMATION CONVERTER METHOD AND SYSTEM.

STATEMENT REGARDING FEDERALLY SPONSORED RESEARCH OR DEVELOPMENT

This invention is related to work performed in contract with the U.S. Government under DARPA NeoCAD Contract N66001-01-C-8042, and the U.S. Government may have certain rights in this invention.

BACKGROUND OF THE INVENTION (1) Field of the Invention

This invention relates to analog to digital converters (ADC), and more particular to a wideband analog to information converter using wavelet filters, a feature extracto, and digital signal processing algorithms.

(2) Description of Related Art

The prior art FIG. 1 illustrates a typical hybrid analog/digital filter bank ADC, where an analog analysis filter bank 100 with filters 102 splits the input signal 104 into M uniform frequency bands. The circuit includes a Radio Frequency (RF) receiver antenna 101 for receiving incoming signals, and a unit 107 for removing the carrier portion of the incoming signal. Unit 107 is comprised of a low noise amplifier 103 that amplifies the incoming signal, an oscillator 105 that modulates the signal to differentiate between the carrier signal and the information containing portion, and a filter 109 that actually filters out or removes the carrier.

The filters 102 of prior art FIG. 1 are characterized by their transfer functions H such as Butterworth or Chebyshev that basically describe a particular method of filtering. By splitting the input signal 104, the effective bandwidth of the signals incident to each sample-and-hold unit 106 is reduced by a factor of M and, hence, the sampling frequency of each converter can be reduced by a factor of M without loss of information with respect to frequency. As illustrated, the input filtered signals are sampled by sample-and-hold units 106, and then processed by the channel processors 108 to the desired resolution of the converter. The channel processors 108 function as quantizers to convert the incoming sampled signal to a binary representation, and also function to remove any unwanted effects (distortions) in an incoming signal 104 due to the medium (e.g. air) through which the signal 104 traveled. In order to achieve a higher data rate, each channel is up sampled by a sample-and-hold unit 110 by a factor of M (because the signals were down-sampled by a factor of M by down samplers 106). The signals are then reconstructed through a digital synthesis filter bank 114 with digital filters 116, and combined at 118 to output a reconstructed signal 120 in the digital domain. The transfer functions of the digital filters 116 are matched with the transfer functions of filters 102 for recombination and reconstruction of the signal at 118. The hybrid filter banks use uniform samplers (sample-and-hold) 106, channel processor 108 and up samplers 110.

The illustrated prior art system functions as a channelized receiver based on the short-time Fourier Transform of signals, and as illustrated in FIGS. 2A and 2B, has no fidelity in time-localized signals. The frequency localized part of the signal in FIG. 2A is clearly represented as the Essential Fourier Coefficients in FIG. 2B, but the time localized part of the input signal illustrated in FIG. 2A is missing from its frequency representation, as illustrated in FIG. 2B. The fundamental basis for this problem is the existing trade-off between frequency and time discrimination of an incoming signal, which is an inherent limitation caused by the existing inverse relationship (inverse proportionality) between these two parameters, where frequency=1/time and time=1/frequency. A broad band in terms of frequency is therefore commensurate to a narrow band in terms of time, and vice versa. Accordingly, variations in narrow band of time (short duration), illustrated as the two spikes in FIG. 2A, may only be "captured" by wide bandwidth filters, and variations in the wide band of time (slow changing) are "captured" by narrow bandwidth filters, such as those used in the prior art FIG. 1. As is clearly illustrated in FIGS. 2A and 2B, for signal variations within a short-duration (such as the spikes illustrated in FIG. 2A), the filtering system of FIG. 1 fails because it cannot "see" them, and hence the output signal 120 cannot accurately represent the entire input signal due to this "unseen" portion.

The prior art ADC system illustrated in FIG. 1 digitizes the entire signal 104, with no intelligence to discriminate between the signal portions containing the required or necessary information and those with no information. This is an inefficient use of resources, which assumes that Digital Signal Processes (DSPs) coupled at the output 120 (not shown) can handle the processing load (i.e. clean-up or removal of the already digitized portions of the signal that carry no information). Therefore, in the process of digitizing the entire signal, the ADC resources are not efficiently utilized. In fact, even interference and jammer signals are converted because no effective interference and jammer mitigation strategy is provided.

In light of the current state of the art and the drawbacks to current systems mentioned above, a need exists for a system and a method that would mitigate these problems and would directly convert analog signal to required information. For conversion of a wideband signal to capture signal variations in short duration, there is a need for wideband ADCs that would have high dynamic range, would have low power consumption, and would have high speed and a wide frequency band of operation, which are currently not available.

BRIEF SUMMARY OF THE INVENTION

The present invention provides an adaptive, intelligent transform based Analog to Information Converter (AIC) for wideband signals by directly converting an analog signal to information (e.g., features, decisions). This direct conversion is achieved by (i) capturing most of the information of a wideband signal via hardware/software implemented mathematical transformations, (ii) effectively removing unwanted signals such as jammer and interfere from the input signal, and (iii) using novel algorithms for highly accurate decision making and feature extraction (e.g., high probability of detection with low probability of false alarm). The jump in the improvement over today's state-of-the-art is in terms of effective and optimum signal information extraction at high-speed.

One aspect of the present invention provides an adaptive, intelligent, transform-based, analog to information converter system comprising:

an analog transform converter module for receiving an analog signal including information and for decomposing the analog signal into a plurality of sub bands; and a feature extraction and classification module coupled with the analog transform converter module for receiving the sub bands from the analog transform converter module and for performing a classification operation for determining analog signal portions corresponding to at least one transmitted analog signal portion and an interference analog signal portion, and increasing the feature-to-noise ratio of the analog signal to maximize the fidelity of the transmitted analog signal portion to generate an improved-fidelity representation of the analog signal.

Another aspect provides an adaptive, intelligent, transform-based, analog to information converter system comprising a sampling module coupled with the analog transform converter module and the feature extraction and classification module to receive the sub bands from the analog transform converter module and to sample each of the plurality of sub bands to produce sampled sub bands, where at least one of the plurality of sub bands is sampled using a sampling rate different from a sampling rate used to sample another of the plurality of sub bands, and to provide the sampled sub bands to the feature extraction and classification module.

Still another aspect provides an adaptive, intelligent, transform-based, analog to information converter system wherein the feature extraction and classification module further comprises a combinatorial selection module for receiving the sampled sub bands and combining sets of sampled sub bands to generate different transform optimally for a given signal.

Yet anther aspect provides an adaptive, intelligent, transform-based, analog to information converter system comprising an adaptable analog-to-digital converter coupled with the feature extraction and classification module for receiving the improved-fidelity representation of the analog signal and for converting the improved-fidelity representation of the analog signal to a digital representation of the analog signal.

A further aspect of the present invention provides an adaptive, intelligent, transform-based, analog to information converter further comprising a digital signal processor coupled with the adaptable analog-to-digital converter for receiving the digital representation of the analog signal and for further processing the digital representation of the analog signal.

Still a further aspect of the present invention provides an adaptive, intelligent, transform-based, analog to information converter system wherein the analog transform converter module comprises a set of n-channelizers, with each channelizer having a bank of filters, where each channelizer receives the analog input signal and wherein the bank of filters in each channelizer operates to decompose the analog input signal into a set of subbands.

A further aspect of the present invention provides an adaptive, intelligent, transform-based, analog to information converter system wherein filters of the channelizers are wavelet filters, wherein a transfer function of the wavelet filter is a wavelet.

Another aspect of the present invention provides an adaptive, intelligent, transform-based, analog to information converter system wherein each wavelet filter comprises a set of electromagnetic resonators coupled such that a transform function of the set of electromagnetic resonators corresponds to the wavelet.

Still another aspect of the present invention provides an adaptive, intelligent, transform-based, analog to information converter system wherein the sampling module samples outputs of the wavelet filters, generating a set of sampled wavelet coefficients where the wavelet coefficients represent energy levels that correspond to frequency bands of a received signal over a time interval.

A further aspect of the present invention provides an adaptive, intelligent, transform-based, analog to information converter system wherein the set of n-channelizers forms a dyadic tree structure of banks of wavelet filters, and wherein combinations of wavelet coefficients are selected by the combinatorial selection module to generate different transforms.

Still a further aspect of the present invention provides an adaptive, intelligent, transform-based, analog to information converter system wherein the adaptable analog-to-digital converters are multi-bandwidth analog-to-digital converters.

Yet another aspect of the present invention provides an adaptive, intelligent, transform-based, analog to information converter system wherein the multi-bandwidth analog-to-digital converters are comprised of a broadband and a $\Delta\Sigma$ High Dynamic Range Narrow Band converters.

Another aspect of the present invention provides an adaptive, intelligent, transform-based, analog to information converter system wherein the multi-bandwidth analog-to-digital converters share a Digital-to-Analog converter, and a first quantizer unit.

A further aspect of the present invention provides an adaptive, intelligent, transform-based, analog to information converter system wherein the adaptable analog-to-digital converters comprise of low-power sub-sampling Analog-to-Digital converters, and are implemented in SiGe BiCMOS.

Still a further aspect of the present invention provides an adaptive, intelligent, transform-based, analog to information converter system wherein the further processing of the digitized improved-fidelity signal includes a synthesis digital wavelet filter bank for reconstruction of the original signal in a digital domain.

Another aspect of the present invention provides an adaptive, intelligent, transform-based, analog to information converter system wherein the further processing of the digitized improved-fidelity signal includes a set of processors for decision making, without reverting to the analog domain.

Yet another aspect of the present invention provides an adaptive, intelligent, transform-based, analog to information converter system comprising:

an adaptive analog decomposition block for receiving a signal including information and having a signal size and for decomposing the signal into a plurality of subbands;

an adaptive digitizer block for receiving the subbands from the adaptive analog decomposition block and removing undesired information from the signal resulting in a compacted signal having a smaller signal size; and a performance evaluation processor for evaluating the performance of at least one of the adaptive analog decomposition block and the adaptive digitizer and for providing a control signal for adjusting the at least one of the adaptive analog decomposition block and the adaptive digitizer to minimize the size of the compacted signal; whereby the adaptive analog to information converter system generates a compacted signal representing the essence of the information in the original signal.

A further aspect of the present invention provides an adaptive, intelligent, transform-based, analog to information converter system wherein the adaptive digitizer block further comprises at least one of an adjustable-rate sampler having a sampling rate and a thresholder having a plurality of levels, and wherein the performance evaluation processor provides a digitizer control signal for adjusting at least one of the sampling rate and the plurality of levels, whereby the resolution of the adaptive digitizer block may be adjusted to minimize the size of the compacted signal.

Still a further aspect of the invention provides an adaptive, intelligent, transform-based, analog to information converter system wherein the performance evaluation processor provides a decomposition control signal to adjust at least one of (a) the individual subbands and (b) the number of subbands into which the signal is decomposed by the adaptive analog decomposition block.

Another aspect of the present invention provides an adaptive, intelligent, transform-based, analog to information converter system wherein the adaptive digitizer block further comprises a correction filter for adjusting for discrepancies between the adaptive analog decomposition block and the digital performance evaluation processor.

A further aspect of the present invention provides an adaptive, intelligent, transform-based, analog to information converter system further comprising an output from at least one of the adaptive digitizer block and the performance evaluation processor for providing the compacted signal for further information processing.

Still a further aspect of the present invention provides an adaptive, intelligent, transform-based, analog to information converter system wherein the performance evaluation processor is incorporated with an information processor for further processing the compacted signal.

Yet another aspect of the present invention provides an adaptive, intelligent, transform-based, analog to information converter system wherein the digital signal processor is a decision support processor which receives the compacted signal and generates a decision based on the compacted signal.

A further aspect of the present invention provides an adaptive, intelligent, transform-based, analog to information converter system, further comprising an output from at least one of the adaptive digitizer block and the performance evaluation processor for providing the compacted signal for synthesis by an adaptive digital synthesis block for combining the subbands to construct an output signal, wherein the performance evaluation processor provides a control signal for adjusting the adaptive digital synthesis block for properly synthesizing the subbands.

Still a further aspect of the present invention provides an adaptive, intelligent, transform-based, analog to information converter system wherein the performance evaluation processor is incorporated with an adaptive digital synthesis block for further constructing an output signal from the subbands, wherein the performance evaluation processor provides a control signal for adjusting the adaptive digital synthesis block for properly synthesizing the subbands.

Another aspect of the present invention provides an adaptive, intelligent, transform-based, analog to information converter method comprising:
receiving a signal including information having a signal size;
decomposing the signal into a plurality of subbands;
removing undesired information from the signal resulting in a compacted signal having a smaller signal size; and
evaluating the performance of at least one of the act of decomposing the signal and the act of removing undesired information from the signal and providing a control signal for adjusting the at least one the act of decomposing the signal and the act of removing undesired information from the signal to minimize the size of the compacted signal; whereby the adaptive analog to information converter method generates a compacted signal representing the essence of the information in the original signal.

Yet another aspect of the present invention provides an adaptive, intelligent, transform-based, analog to information converter system comprising means for:
receiving a signal including information having a signal size;
decomposing the signal into a plurality of subbands;
removing undesired information from the signal resulting in a compacted signal having a smaller signal size; and
evaluating the performance of at least one of the act of decomposing the signal and the act of removing undesired information from the signal and providing a control signal for adjusting the at least one the act of decomposing the signal and the act of removing undesired information from the signal to minimize the size of the compacted signal; whereby the adaptive analog to information converter method generates a compacted signal representing the essence of the information in the original signal.

A further aspect of the present invention provides an adaptive, intelligent, transform-based, analog to information converter computer program product comprising means, encoded on a computer-readable medium, for:
receiving a signal including information having a signal size;
decomposing the signal into a plurality of sub bands;
removing undesired information from the signal resulting in a compacted signal having a smaller signal size; and
evaluating the performance of at least one of the act of decomposing the signal and the act of removing undesired information from the signal and providing a control signal for adjusting the at least one the act of decomposing the signal and the act of removing undesired information from the signal to minimize the size of the compacted signal; whereby the adaptive analog to information converter method generates a compacted signal representing the essence of the information in the original signal.

Another aspect of the present invention provides an analog-to-digital converter module comprising:
a coarse converter block for converting an analog input signal into a coarse-band reduced-noise signal including:
an coarse-converter input for receiving an analog input signal;
a filtering loop coupled with the coarse-converter input, the filtering loop including:
an adder coupled with the coarse-converter input for receiving the analog input signal and for producing an adder output signal;
a noise filter coupled with the adder for receiving the adder output signal, and for filtering the adder output signal to produce a reduced-noise analog signal;
an analog-to-digital converter coupled with the noise filter for converting the reduced-noise analog signal to a reduced-noise digital signal;

a digital-to-analog converter coupled with the analog-to-digital converter for receiving the reduced-noise digital signal, for converting the reduced-noise digital signal to an analog feedback signal, the digital-to-analog converter coupled with the adder for providing the analog feedback signal to be added to the analog input signal for producing the adder output signal; and an output for outputting the reduced-noise digital signal; and a broadband-converter block for converting an analog input signal into a broadband reduced-noise signal, where the broadband-converter block shares the analog-to-digital converter and the digital-to-analog converter of the coarse-converter for converting the analog input signal into a broadband digital output signal.

Yet another aspect of the present invention provides an analog-to-digital converter module wherein the broadband-converter block further comprises:

an broadband-converter input for receiving the analog input signal;

a sample-and-hold module coupled with the broadband-converter input for receiving the analog input signal and for generating a broadband signal for provision to the analog-to-digital converter of the coarse converter block, where the analog-to-digital converter of the coarse converter block is configured to receive the broadband signal and to convert the broadband signal to a coarse digital signal, and wherein the digital-to-analog converter of the coarse converter block is configured to receive the coarse digital signal from the analog-to-digital converter of the coarse converter block and to generate an analog coarse signal;

a subtractor for receiving the broadband signal from the sample-and-hold module and the analog coarse signal from the digital-to-analog converter and for subtracting the analog coarse signal from the broadband signal to produce a difference signal;

a fine analog-to-digital converter for receiving the difference signal from the subtractor and for converting the difference signal into a fine digital signal;

an encoder for receiving the fine digital signal from the fine analog-to-digital converter and the coarse digital signal from the analog-to-digital converter of the coarse converter block and for generating an encoded digital signal from the fine digital signal and the coarse digital signal; and an output coupled with the encoder for outputting the encoded digital signal.

A further aspect of the present invention provides an analog-to-digital converter module wherein the broadband-converter block further comprises, an N-bit Digital-to-Analog Converter (DAC) for receiving a feedback signals to cancel interfering signals before the analog input signal is quantized.

Still a further aspect of the present invention provides an analog-to-Digital Converter (ADC) module, comprising:

a low power sub-sampling ADC having a piplined architecture that is comprised of a variable gain amplifier for amplification of an analog input signal, the variable gain amplifier coupled with a sub-sampling sample-and hold-module for sampling and holding the input signal until a n-bit pipline quantizer is ready to receive and then quantize the input signal; and where the ADC module is further comprised of a control module for controlling the functions of the variable gain amplifier, sub-sampling sample-and-hold module, and the n-bit pipline quantizer.

Another aspect of the present invention provides an analog-to-Digital Converter (ADC) module, sample-and-hold module is configured to sample the input signal significantly below a Nyquist sampling rate.

Yest another aspect of the present invention provides an analog-to-Digital Converter (ADC) module wherein the low power sub-sampling ADC further comprises, an N-bit Digital-to-Analog Converter (DAC) for receiving feedback signals to cancel interfering signals before the analog input signal is quantized.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention.

Referring to the drawings in which like reference character(s) present corresponding parts throughout:

FIG. 7A is an exemplary illustration of a signal in accordance with both embodiments of the present invention;

FIG. 7B is an exemplary illustration of a graph of frequency responses of filters within FIG. 6A, in accordance with both embodiments of the present invention;

FIG. 15A is an exemplary illustration of a multi-bandwidth InP HBT ADC in accordance with the second embodiment of the present invention;

FIG. 15B is an exemplary illustration of a SiGe BiCMOS low power sub-sampling ADC in accordance with the second embodiment of the present invention;

Figure 1:
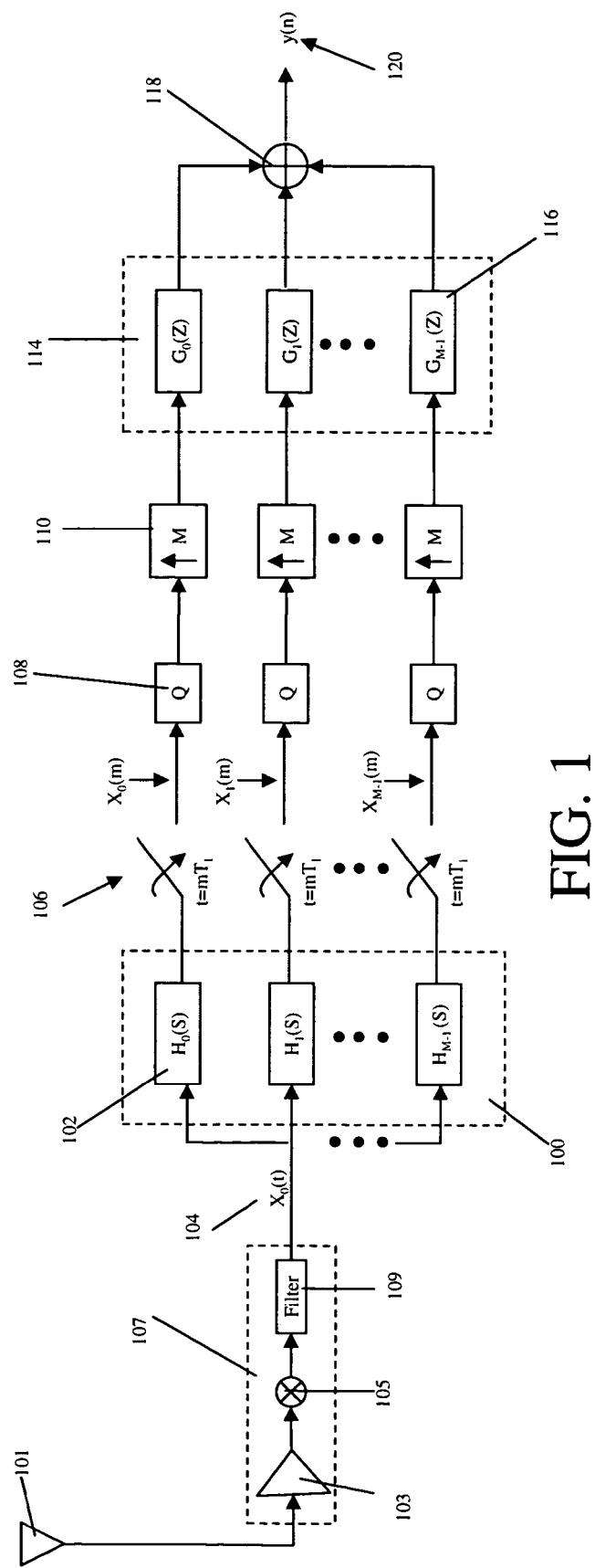
FIG. 1 is a prior art exemplary illustration of a typical Analog-to-Digital Converter (ADC)
Figure 2A:
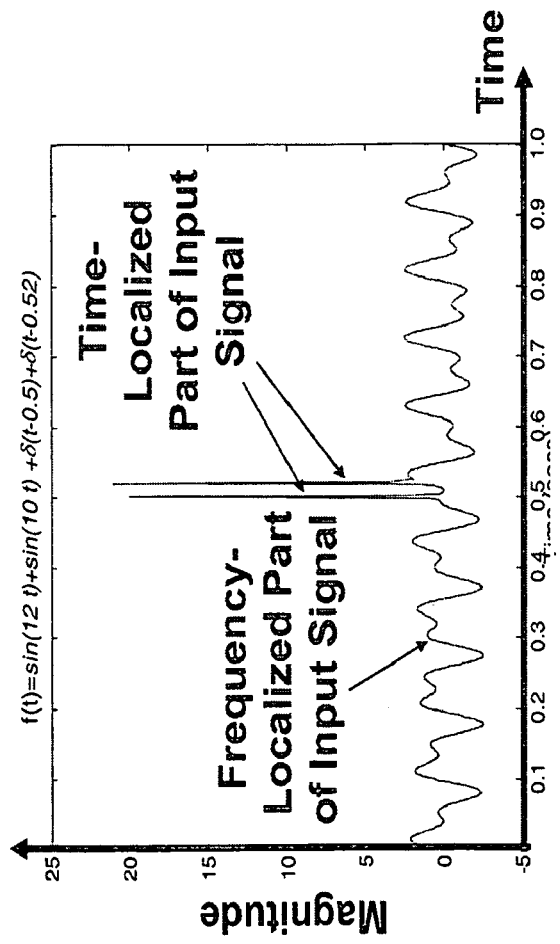
FIG. 2 is a prior art exemplary graph of frequency responses of filters within the prior art FIG. 1 ADCs.
Figure 2B:
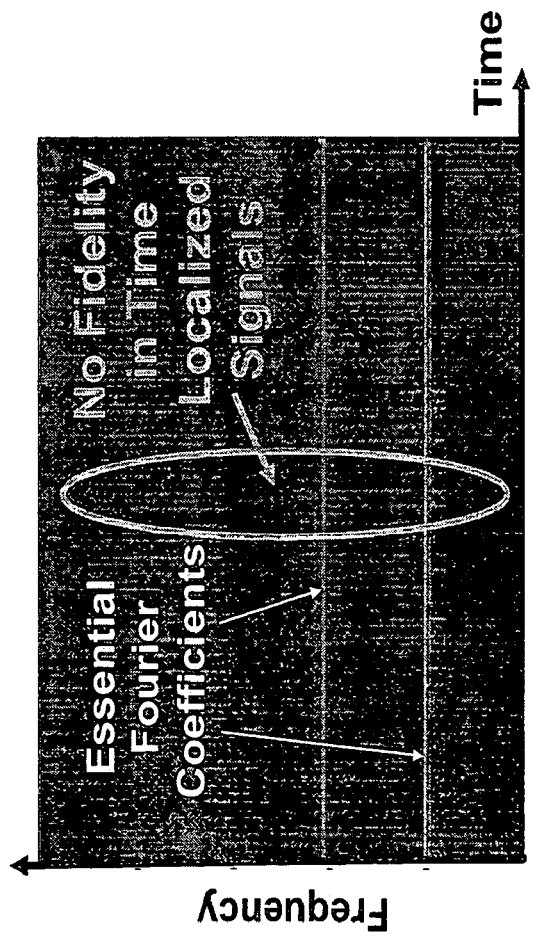

DETAILED DESCRIPTION OF THE INVENTION (1) Introduction

Most of the advanced radar and communication applications need direct conversion of analog signal to information. Today, this is achieved by first digitizing the entire input signal and then processing the digitized signal by digital signal processors. However, in the digital signal processing most of the digitized samples are eliminated since they do not have the required information and are not used in the actual high-level processes such as decision making for example, target detection/recognition. This means that most of the power and resources are wasted with respect to the required output. In addition, in a traditional wideband digitization system, wideband ADCs are required that are not available today. However, the present invention mitigates these problems and directly converts analog signal to required information. The adaptive, intelligent transform based analog to information converter of the present invention directly converts analog signals to information without the necessity of digitizing the entire signal. This leads to a many-fold improvement in "effective resolution-speed product" in terms of information accuracy-speed product.

Before providing details regarding various methodologies of the invention, first a glossary of terms is provided as a reference for the reader. Next, a system overview is provided, describing the interconnection and operation of various major components of a system in accordance with the present invention. After the system overview, a data processing system overview is presented to acquaint the reader with the various components typically found in a data processing system that may be used in conjunction with the present invention. Next, a discussion section is provided in which the various major components presented in the system overview are discussed in detail. Finally, a result section is provided, which presents non-limiting examples of the operation of the present invention in order to provide a more tangible understanding of the operation of the invention.

(2) Glossary

In order to provide a working frame of reference, a glossary of some of the terms used in the description and claims is given as a central resource for the reader. The glossary is intended to provide the reader with a general understanding of various terms as they are used in this disclosure, and is not intended to limit the scope of these terms. Rather, the scope of the terms is intended to be construed with reference to this disclosure as a whole and with respect to the claims below. Further, the definitions provided should not be considered limiting to the extent that the terms are known in the art. These definitions are provided to assist in the understanding of the present invention.

Adaptive Filters—Adaptive filters are re-configurable filters with respect to their change in the bandwidth, filter order, etc.

Bank of bank of filters—A plurality of sets (or banks) of filters is a bank of bank of filters.

Channel—A channel is comprised of a bank of filters with the same bandwidth response.

Dyadic tree structure—Dyadic tree structure is an arrangement of filters whose bandwidths half from one level to the next.

Essential Wavelet Coefficients—Wavelet coefficients that are essential for performance or use in a system or application, comprise the essential wavelet coefficients.

Frequency Localized Signal—The portion of a signal with certain fixed frequency and long duration of time is a frequency-localized signal.

Quantization—Quantization is the representation of an analog signal in discrete (or digital) formats.

Tile—A tile is an explanatory representation of how wavelet coefficients represent energy levels, which in turn represent the existence of a specific frequency component within a signal in a given time.

Time Localized Signal—The portion of a signal with certain frequency and short duration of time is a time-localized signal.

Wavelet Coefficient—Wavelet coefficients are time-frequency responses of a signal. They are the result of the wavelet transform on a signal.

(3) System Overview

The present invention provides an adaptive, intelligent transform based Analog to Information Converter (AIC) for wideband signals by directly converting an analog signal to information (e.g., features, decisions). This direct conversion is achieved by (i) capturing most of the information of a wideband signal via hardware/software implemented mathematical transformations, (ii) effectively removing unwanted signals such as jammer and interfere from the input signal, and (iii) using novel algorithms for highly accurate decision making and feature extraction (e.g., high probability of detection with low probability of false alarm).

The jump in the improvement over today's state-of-the-art is in terms of effective and optimum signal information extraction at high-speed. This new concept will provide critical elements for the Government's Signal Intelligence (SIGINT) programs and for the future generation multifunction radar systems, such as all-weather radar, surveillance, reconnaissance, and smart weapons systems.

Figure 3A:
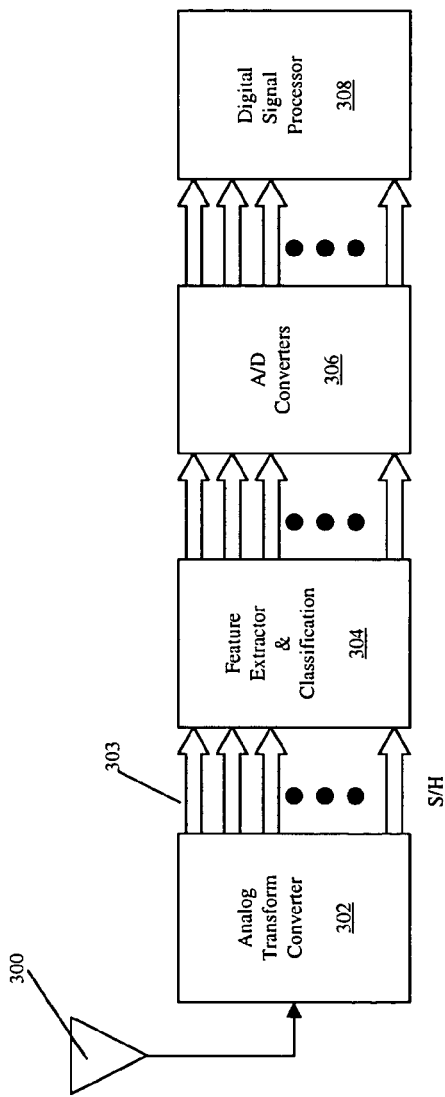
FIG. 3A is an exemplary system overview illustration of an adaptive, intelligent transform based ADC system in accordance with a first embodiment of the present invention.
Figure 3B:
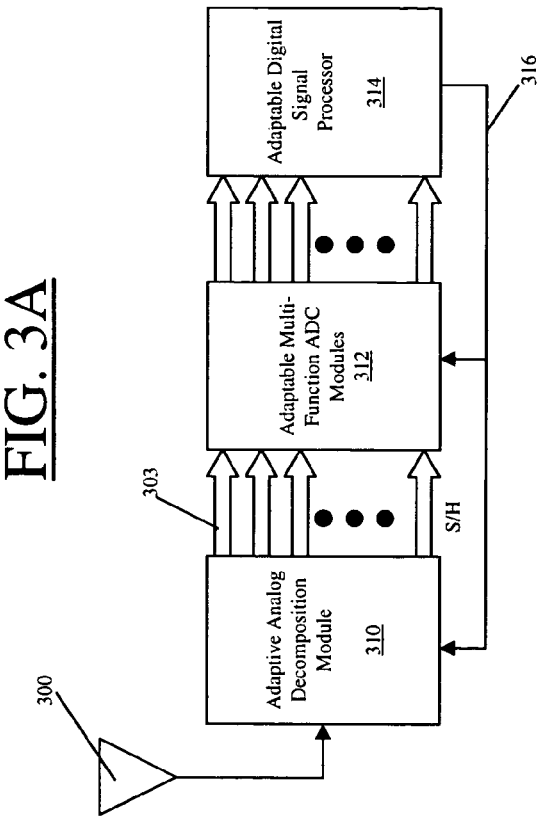
FIG. 3B is an exemplary system overview illustration of an adaptive, intelligent transform based ADC system in accordance with a second embodiment of the present invention.

FIGS. 3A and 3B are the system overview of the respective first and second embodiments of the present invention. Although both embodiments are illustrated as wireless systems, it should be understood that all features may also be used in a wired environment. As illustrated in FIG. 3A, the first embodiment is comprised of an Analog Transform Converter 302, which decomposes (splits) an incoming signal into sub-bands. Each sub band signal is then sampled by a sampler 303 and project directly onto a space/time/frequency feature space using a dyadic filter tree-structure. The Feature Extractor and Classification Module 304 is a learning architecture that sorts out signals output from the Analog Transform Converter 302 by grouping and further processing the transformed coefficients. It also excises identified interference signals, and optimizes transform coefficients to provide maximum "feature-to-noise" description of Radio Frequency (RF) signal. The Analog-to-Digital (A/D) Converter 306 provides digitization of features using direct conversion A/Ds. The Digital Signal Processor 308 effectively processes multiple digital signals in the transformed domain, and provides high fidelity digital representation of input signals. It also effectively mitigates hardware non-idealities, and effectively mitigates interferes and jammers.

The system overview of the second embodiment illustrated in FIG. 3B comprises of an Adaptive Analog Decomposition Module 310, which also decomposes (splits) an incoming signal into sub-bands. Each sub-band signal is then sampled by a sampler 303 and projected directly onto a space/time/frequency feature space using a dyadic filter tree-structure. The Adaptive Analog Decomposition Module 310 differs from that of the first embodiment illustrated in FIG. 3A in many aspects, including the use of variable wavelet filters that may be varied by a feedback control signal 316 in terms of their transfer functions. Using the feedback control signal 316 from the Digital Signal Processors (DSP) 314, the Adaptable multi-function Analog-to-Digital Converter modules 312 function to excise identified interference signals, and optimize transformed wavelet coefficients output from the Adaptive Analog Decomposition Module 310 to provide maximum "feature-to-noise" description of Radio Frequency (RF) signal. The term adaptable in the second embodiment refers to the fact that a plurality of A/D converters exist and are shared with different banks of wavelet filters within the Adaptive Analog Decomposition Module 310, and depending on the feedback control signal 316 received, the appropriate set of A/D converters are activated. This "sharing" scheme saves hardware and power resources. For clarity, the frist embodiment will first be described, followed by the description of the second embodiment.

(4) Data Processing System Overview

Figure 5:
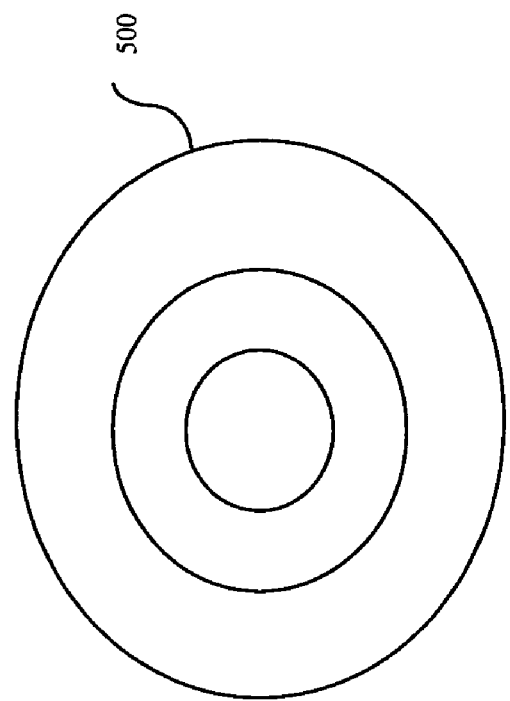
FIG. 5 is an exemplary illustration of a data storage unit (medium) in accordance with both embodiments the present invention.
Figure 4:
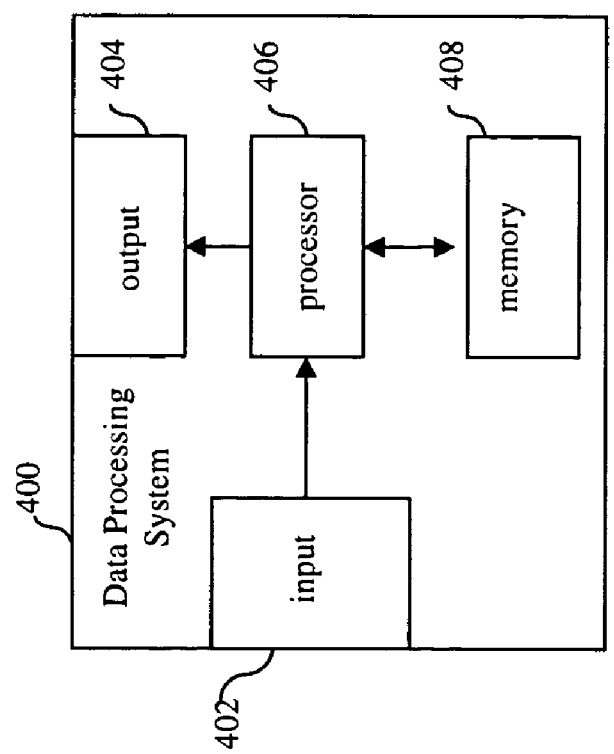
FIG. 4 is an exemplary illustration of a data processing system in accordance with both embodiments of the present invention.

For purposes of illustration, programs and other executable program components may be illustrated herein as discrete blocks, although it is recognized that such programs and components may reside at various times in different storage components, and are executed by the exemplary data processor(s) of the computers described in detail below. A block diagram depicting the components of a computer system used in all the embodiments of the present invention is provided in FIG. 4. The data processing system 400 comprises an input 402 for receiving image data input signals from any inputting mechanism, including but not limited to, an external computer connected to the system, an Internet connection, or any computer readable medium 500 (illustrated in FIG. 5) such as a floppy disk, Compact Disk (CD), a Digital Versatile Disk/Digital Video Disk (DVD), and a removable hard drive. The input 402 may also be configured for receiving user input from another input device such as keyboard, a mouse, or any other input device best suited for the current environment conditions (e.g. image processing). Note that the input 402 may include multiple "ports" for receiving data and user input, and may be configured to receive information from remote databases using wired or wireless connections. The output 404 is connected with the processor 406 for providing output to the user, possibly through a video display. Output 404 may also be provided to other devices or other programs, e.g. to other software modules, for use therein, possibly serving as a wired or wireless gateway to external databases or other processing devices. The input 402 and the output 404 are both coupled with a processor 406, which may be a general-purpose computer processor or a specialized processor designed specifically for use with the present invention. The processor 406 is coupled with a memory 408 to permit storage of data and software to be manipulated by commands to the processor.

(5) Discussion (I) First Embodiment

This portion of the description focuses on the operation of each of the individual components of the first embodiment illustrated in the system overview shown in FIG. 3A. However, the general overall concepts described below in relation to FIGS. 6A to 6B, 7A, 7B, and 9A to 9C apply equally to both the Analog Transform Converter Module 302 of the first embodiment and the Adaptive Analog Decomposition Module 310 of the second embodiment. For clarity and ease of readability, only terms "Analog Transform Converter Module 302" will be used in this section of the description in relation to FIGS. 6A to 6B, 7A, 7B, and 9A to 9C. However, it should be understood that the terms "Adaptive Analog Decomposition Module 310" can be equally substituted for the terms "Analog Transform Converter Module 302" within this section of the description, in relations to FIGS. 6A to 6B, 7A, 7B, and 9A to 9C.

Figure 6A:
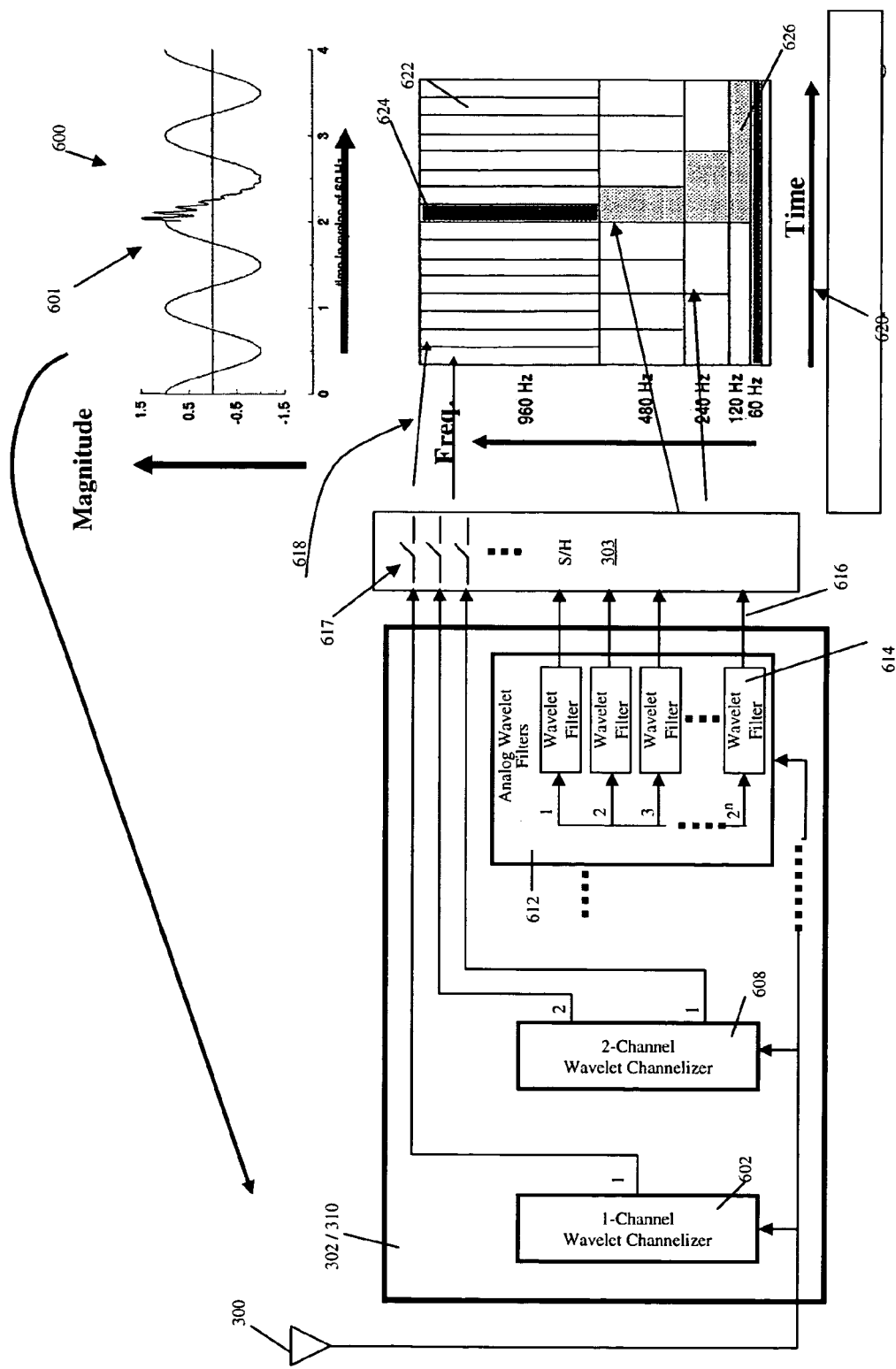
FIG. 6A is an exemplary system overview of a set of wavelet filter banks, including a "tile" plot illustrating wavelet coefficient projections in accordance with both the first and the second embodiments the present invention.

(a) Analog Transform Converter Module 302:

FIG. 6A illustrates an exemplary system overview of an Analog Transform Converter 302. The overall operational concept and the disclosed architecture includes the analog pre-processing of a wideband signal, which is performed by splitting it into several smaller variable bandwidth sub-bands 616 using a set of bank of filters 614 such as wavelet filter bank which is similar to performing a sub-band decomposition (or the wavelet transform if wavelet filter bank is used) in the analog domain. The result of this is a set of variable number of coefficients 618 at different bands with variable resolution, which could be quantized at different bit-rates, and amplitude resolutions. This transformation may be interpreted as a projection, which is the result of filtering and sampling of the input signal into the time-scale or time-frequency space, where the sampled coefficients 618 in each sub-band or time-frequency localized region (tile) 622 contain the information of a signal in the analog domain.

Graph or plot 620 is an explanatory figure, illustrating the projection of the coefficients 618 in frequency and time domains, which is the result of the transformation (filtering and sampling) of the input signals. As illustrated, Analog Transform Converter 302 is comprised of a plurality of wavelet channelizers, with each having a specific filter band. For example, the 1-channel wavelet channelizer 602 has a single band wavelet coefficient 616 output (a single analog passive wavelet filter 614), whereas the $N^{th}$ channel wavelet channelizer 612 has $2^N$ analog passive wavelet filters 614, splitting an incoming signal into $2^N$ output wavelet coefficients 616. Hence, each channel may comprise of a plurality of analog passive wavelet filters 614 (or a bank of a bank of analog passive wavelet filters), forming a dyadic tree structure.

Figure 6B:
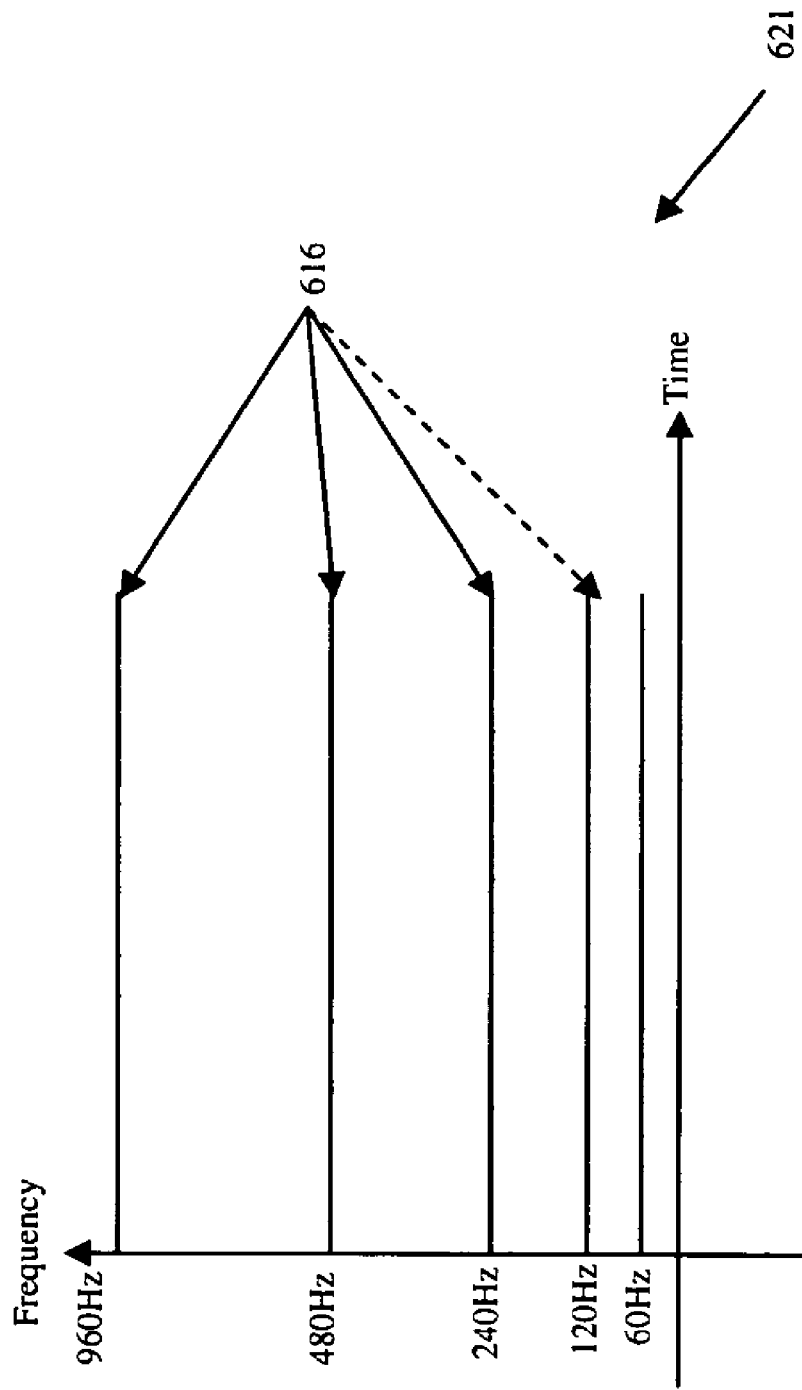
FIG. 6B is an exemplary representation of various frequency bandwidths output by the set of wavelet filter banks illustrated in FIG. 6A, in accordance with both the first and the second embodiment of the present invention.

As illustrated, an exemplary incoming signal 600 from the receiver antenna 300 (or a wired connection) passes through all N channels of the Analog Transform Converter 302 simultaneously, and decomposes (splits) in accordance with the number of wavelet filters 614 that are within each channel. The wavelet coefficients 616 of all the wavelet filters within all the N channels are then sampled by a sampler 303 at different rates, and as projections 618 (sampled coefficients) onto a "tile" graph (plot) format in terms of time and frequency to better illustrate the concepts related to the overall functionality of the Analog Transform Converter 302. As an example, assume that bandwidth of the single wavelet filter 614 in the 1-channel wavelet channelizer 602 is 960 Hz. In this exemplary case, if the 600 also contains a bandwidth component of 960 Hz, then the filter 614 will pass all the frequency component of the signal 600 that correspond to the 960 Hz frequency. The graph 621 in FIG. 6B represents some of the exemplary wavelet coefficient 616 of a few channels in terms of their frequency and time. Note that graph 621 of FIG. 6B represents exemplary wavelet coefficients 616 that are not yet sampled, and the amplitude values (intensities) corresponding to coefficients. The present invention samples the wavelet coefficients 616 at different sampling rates by a sampler unit 303. The non-uniform rate of sampling of the wavelet coefficients 616 by the sampler 303 generate the sampled wavelet coefficients 618, which are represented as "tiles" 622 having perimeters defined by both the time and the frequency domains. The wavelet coefficients may be represented mathematically by $x(t)*\Psi((t-b)/(a))$, where "a" is the scale that corresponds to the bandwidth of the filters, b is the translation that corresponds to the time, t represents time, and the symbol "*" is the convolution operator. The sampled wavelet coefficients 618 are generated when "b" is digitized. That is, they correspond to coefficients of discretized wavelet transform.

Referring back to FIG. 6A, the dark vertical tile 624 of graph 620, which is narrow in terms of time and wide in terms of frequency represents energy (or wavelet coefficient) at the 960 Hz frequency within a sampled time. The tile 624 indicates that signal 600 has energy within that frequency band (e.g. the 960 Hz), which means that signal 600 has a 960 Hz frequency component. This represents the actual variation 601 of signal 600, which has a wide frequency component in a short or narrow time. Note that no other frequency component is "detected" by the first channelizer filter due to its bandwidth. The second channel 608 splits the signal 600 bandwidth into two, which in the exemplary case outputs the frequency components (if any) of signal 600 between 0 to 480 Hz and 480 to 960 Hz. The third channel splits the same signal into four bandwidths between 0 to 240 Hz, 240 to 480 Hz, 480 to 720 Hz, and 720 to 960 Hz. As illustrated in the graph 620 of FIG. 6A, as the signal bandwidth is split (the frequency is reduced), the sizes of the tiles 622 in terms of time widen and in terms of frequency shortened (become narrower). In the last $N^{th}$ channel wavelet channelizer 612, the signal is split by the $2^N$ wavelet filters 614 therein into $2^N$ sub-bands (wavelet coefficients) 616. In this exemplary case, suppose that the signal 600 also happens to have a narrow frequency component of 60 Hz. As illustrated, the wavelet coefficients 616 of these wavelet filter 614 map (or project) onto the tile 626, which is narrow in terms of frequency and wide in terms of time. The colored tile 626 indicates that signal 600 has energy within that frequency band (e.g. the 60 Hz), which means that signal 600 has a 60 Hz frequency component at the given sampled time. This represents the actual, normal sinusoidal signal 600 without the short variation 601. That is, no other frequency component is "detected" by the $N^{th}$ channelizer filters because of their bandwidth. In other words, the 960 Hz component of the signal 600 representing the "spike" or short variation 601 is not detected by these particular banks of filters.

Unlike the prior art filtering schemes, the Analog Transform Control module 302 of the present invention "captures" all signal variations in both the narrow band of time (short duration) and in narrow band of frequency. Therefore, the broadband filtering capability of the Analog Transform Control 302 in the frequency domain enables capturing of "local" variation (e.g. 601) of the signal 600 in time. In the narrow frequency band (e.g. 60 Hz), the Analog Transform Control 302 "captures" the slow signal variations. Accordingly, as illustrated in FIGS. 7A and 7B (which represent an actual signal), the Analog Transform Converter 302 and the sampler 303 can represent the totality of any incoming signal by "capturing" most, if not all variations of an incoming signal, with minimum loss of information in terms of both frequency and time.

The arrangement of the channelizers and use of analog passive wavelet filters 614 in each channelizer and the different rate of sampling by the sampler 303 also enable the complete representation of an incoming signal with fewer numbers of coefficients, compared with the traditional non-wavelet based technologies. As mentioned above, the processing of incoming signals through the prior art traditional filters 102 and the sampler units 106 generate coefficients that form a non-orthogonal basis signal for projecting an incoming signal into feature space. The non-orthogonal nature of the basis representations generate redundancies due to overlapping, and hence a greater number of coefficients 102 and sampler units 106 are required to fully project an incoming signal into a feature space. In addition, post-processing of the basis representation is required to "clean" the signal to reconstruct the incoming noise-less signal.

The analog passive wavelet filters 614 of the Analog Transform Control 302 in combination with the non-uniform sampler 303 generate wavelet coefficients that form an orthogonal basis for projecting an incoming signal into space/time/frequency feature space 620. That is, the orthogonal nature of each of the wavelet coefficients provides non-redundant information, enabling complete reconstruction of the incoming signal minimal post-processing. The wavelet coefficients represent the energy of signal "mapped" or projected onto the space/time/frequency feature space 620, represented by every "tile" 622. It should be noted that varying sampling rates or the use of different wavelet-filter configurations (e.g. change in the number of filters in each channel, varying channel numbers, or filter bands, etc.) will generate many wavelet projections 618., and therefore a proper selection of "tiling" 622 configuration that best represents or "fits" an incoming signal is required. In general, the goal is to use the smallest number of wavelet coefficients that would allow for representation of signal energy in its entirety. For example, coefficients for the variation 601 in the incoming signal 600 are projected in the frequency/time plane by the vertical dark colored section 624, which represent the energy levels of the coefficients within a time frame of that variation, and the rest of the incoming signal 600, by the horizontal tile 626. The white "tiles" 622 represent coefficients with zero value, having zero energy. These coefficients will not be used in later processing, saving resources.

Figure 8:
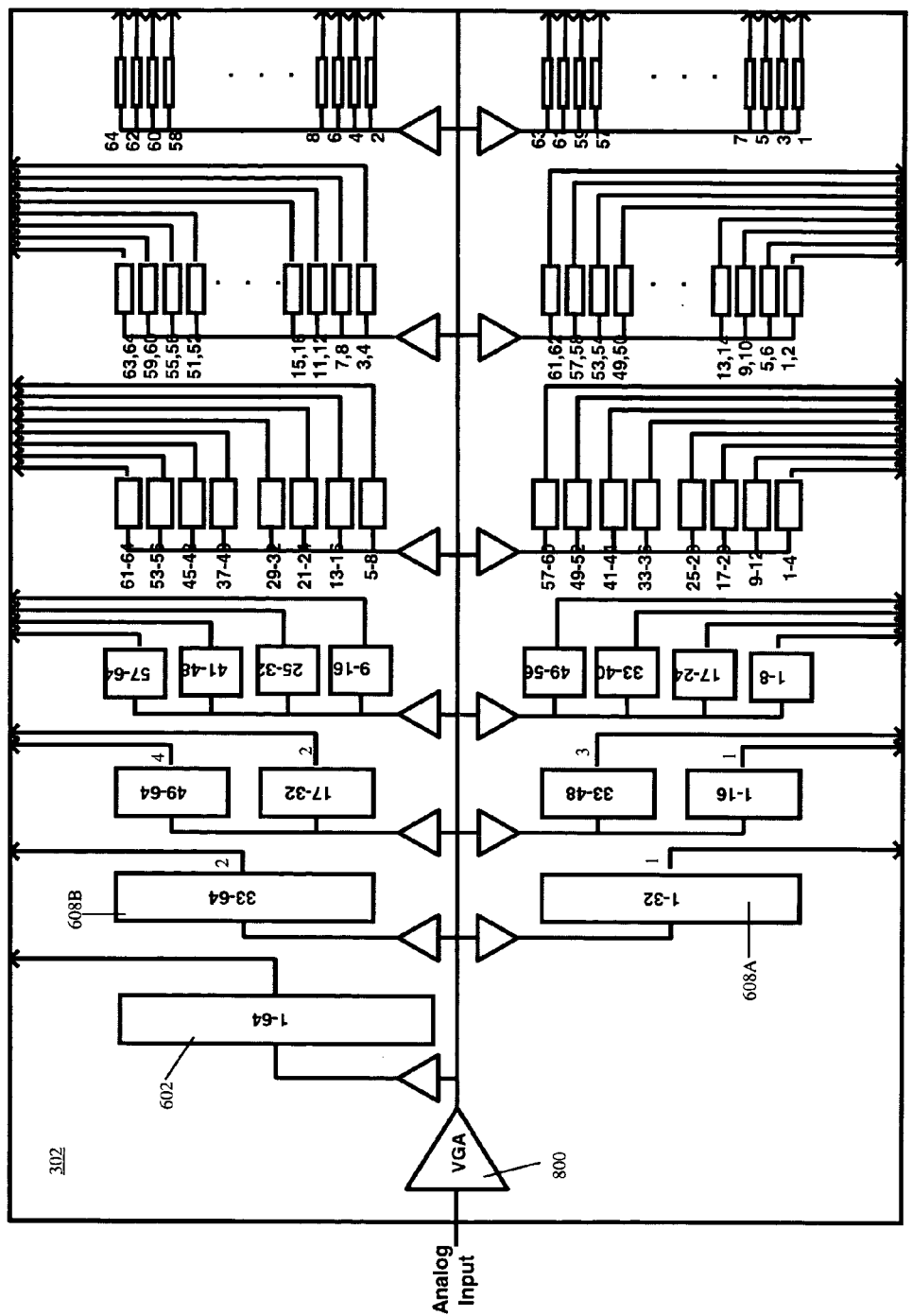
FIG. 8 is an exemplary specific implementation of a seven stage Analog Transform Converter illustrated in both FIGS. 3A and 6A, in accordance with the first embodiment of the present invention.

FIG. 8 is one exemplary specific implementation of a seven stage Analog Transform Converter 302 illustrated in both FIGS. 3A and 6A, in accordance with the first embodiment of the present invention. Each stage of the Analog Transform Converter 302 illustrated in FIG. 8 represents a channel of the channelizers. In each stage, the filters have the same bandwidths and their bandwidths half from one level to the next higher level. The filters are arranged into special architectures forming noncontiguous multiplexer pairs. This special arrangement eliminates the crossover frequency uncertainties commonly present in contiguous multiplexers. The exemplary Analog Transform Converter 302 illustrated includes a Variable Gain Amplifier 800, which amplifies the incoming analog. The signal is then forwarded to all the channels (stages) for filtering. In FIG. 8, the 1-channel wavelet channelizer 602 of FIG. 6A is represented at stage 1, the 2-channel wavelet channelizer 608 of FIG. 6A is represented at stage 2, and so on. As illustrated, the multi-channel wavelet channelizers are physically split to eliminate crossover frequency uncertainties. For example, the 2-channel wavelet channelizer 608 of FIG. 6A is split into two "sub-channelizer" 608A and 608B when implemented. In this embodiment, all output by the Analog Transform Converter 302 are input to the Feature Extractor and Classification Module 304 for further processing. This transform based ADC example can implement any combination of wavelet, wavelet packet, and transforms ranging from the simplest dyadic wavelet transform (6 ADCs required) to a straight Short-Time-Fourier transform at the lowest level (64 ADCs required).

Figure 9A:
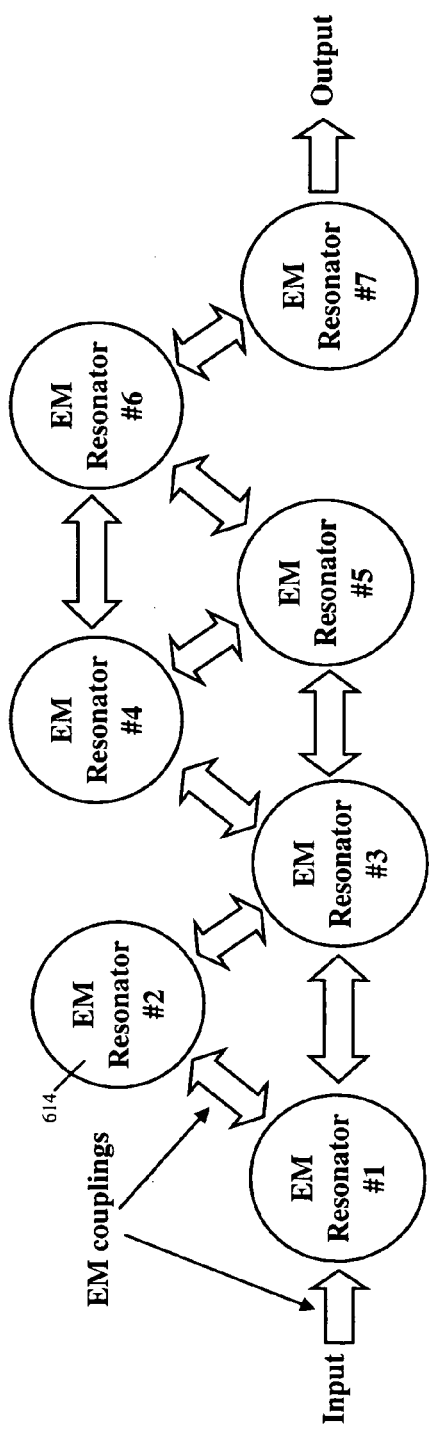
FIGS. 9A to 9C are exemplary illustrations of actual wavelet filters, and their inter-coupling schemes in accordance with both embodiments of the present invention.
Figure 9C:
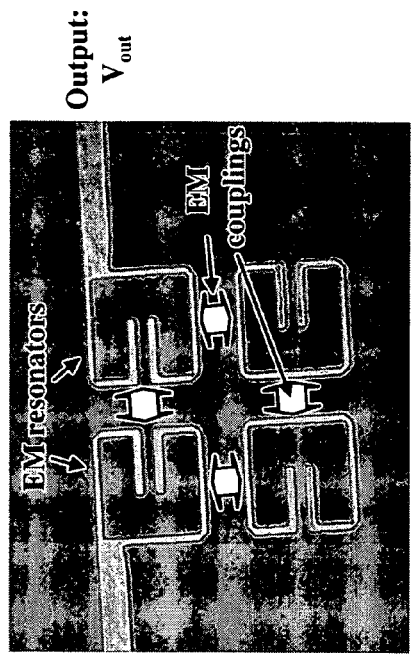
Figure 9B:
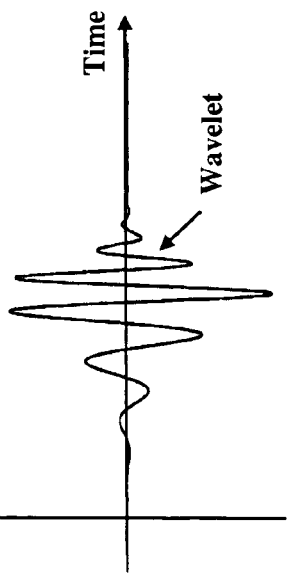

FIG. 9A is an exemplary schematic illustration of each wavelet filters 614 in the various channelizers, which are implemented as electromagnetically coupled electromagnetic (EM) resonators, where the filter time domain transfer function corresponds to a wavelet, illustrated in the exemplary graph in FIG. 9B. FIG. 9C illustrates an exemplary implementation of wavelet filter using EM coupled microstrip EM resonators. In general, any type of EM resonators may be used, and the distances and the general topography between and amongst the EM resonators will dictate the type of transfer function that will be generated. Hence, reverse engineering will allow for the proper design of wavelet filters to match a desired transfer function. That is, given a transfer function, the EM resonators may be arranged in such a manner to generate the given function. Although in general the exemplary EM resonators and their exemplary arrangement illustrated in FIGS. 9A to 9C work with Radio Frequency (RF) signals, they can be modified for other types of signals or signal mediums.

Figure 10A:
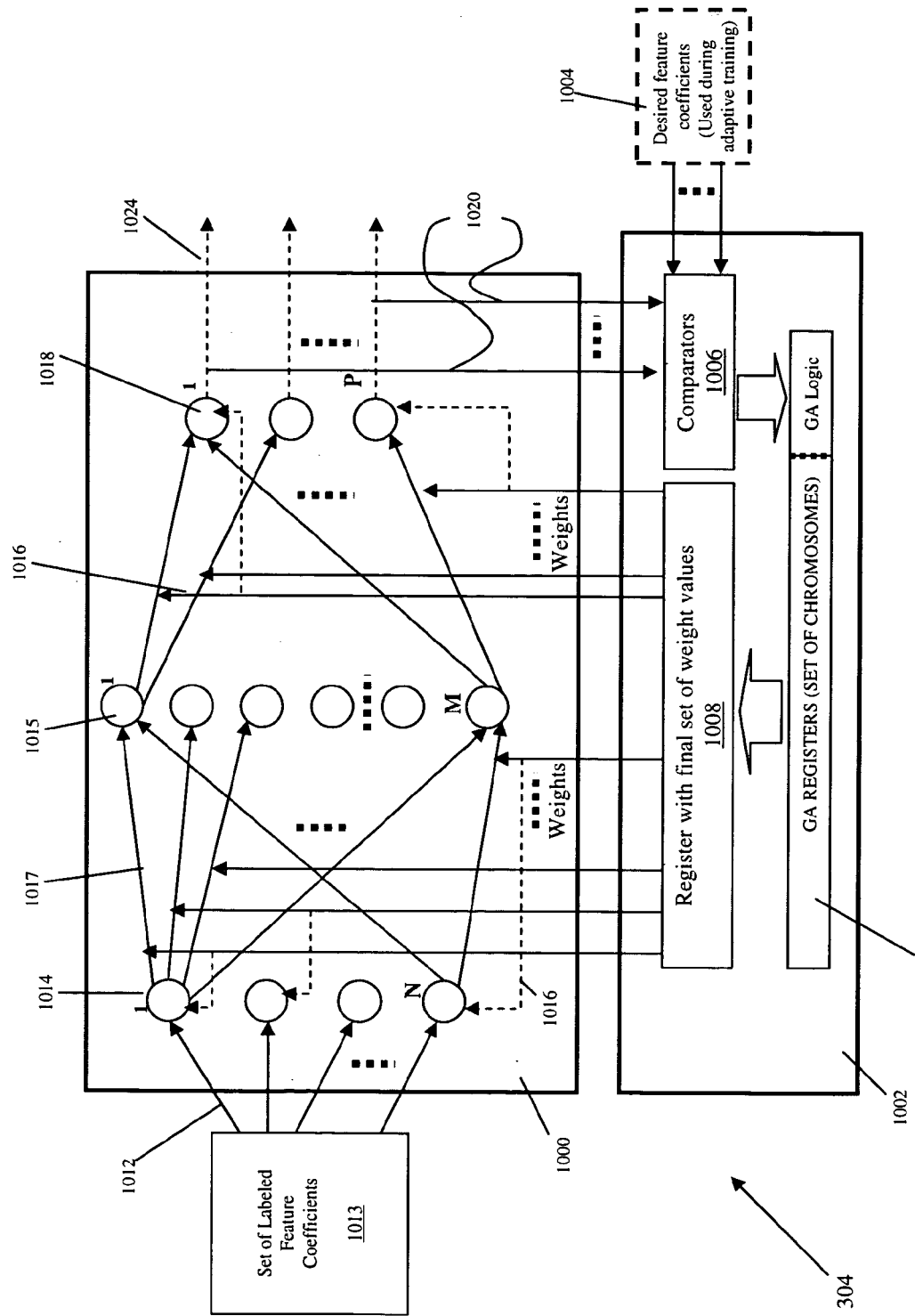
FIG. 10A is an exemplary illustration of a learning architecture in accordance with the first embodiment of the present invention.
Figure 10B:
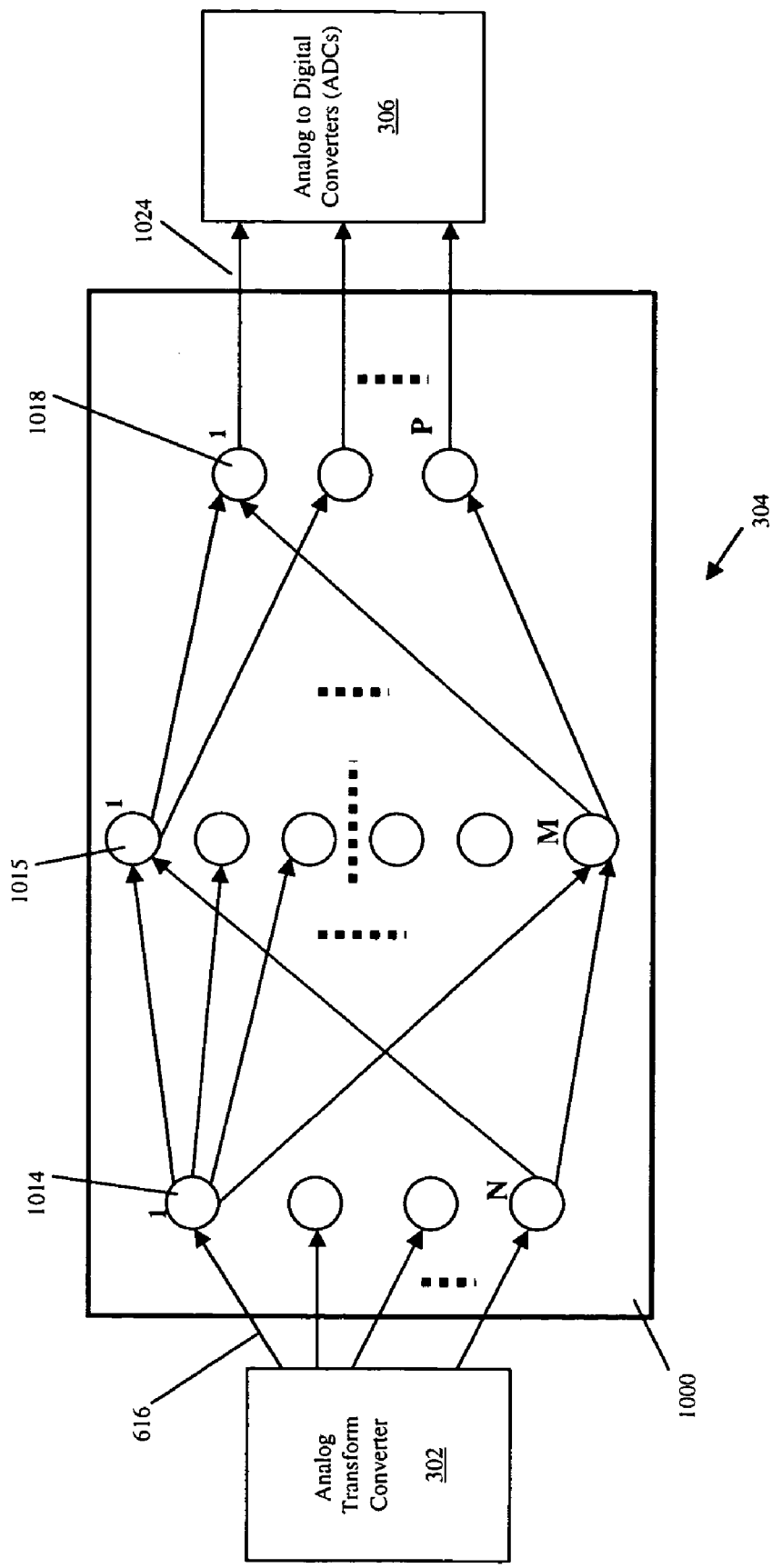
FIG. 10B is an exemplary illustration of a learned architecture in accordance with the first embodiment of the present invention.

(b) Feature Extractor and Classification Module 304:

FIG. 10A is an exemplary illustration of a Feature Extractor and Classification Module 304 used in the learning mode, and FIG. 10B illustrates an already learned Feature Extractor and Classification Module. As illustrated in FIG. 10B, the Feature Extractor and Classification Module 304 is a learned architecture that receives analog signals (wavelet coefficients 618) from the sub-bands of the Analog Transform Control 302, and determines the portions of the received analog signal that correspond to a transmitted analog signal portion and an interference analog signal portion. It then sorts the transmitted analog signal output by grouping and further processing the transformed coefficients. It also excises identified interference signals, and optimizes transform coefficients to provide maximum "feature-to-noise" description of Radio Frequency (RF) signal, which maximizes the fidelity of the transmitted analog signal portion to generate an improved-fidelity analog signal.

The Feature Extractor and Classification Module 304 may for example be formed of an analog implemented neural network, which is well known. As a learning architecture, the Feature Extractor and Classification Module 304 is trained to identify essential analog wavelet coefficients, and ignore the rest. The Feature Extractor and Classification Module 304 can obviously be retrained to recognize analog wavelet coefficients that represent different varieties of input signals, based on intended use. The present invention uses desired feature coefficients 1004 (illustrated in FIG. 10A) for adaptive training of the Feature Extractor and Classification Module 304.

As illustrated in FIG. 10A, the Feature Extractor and Classification Module 304 in the learning mode is comprised of neural network 1000, and its corresponding training circuitry (or feedback) 1002. It should be noted that both components are comprised of algorithms, and can be implemented on the same computer or a chip. In the learning mode, outputs 1012 represent a set of labeled feature coefficients 1013 in the form of wavelet coefficients, representing a previously known and labeled set of energy levels (wavelet coefficients) within each of the N-channelizer, which are fed to the neural network learning architecture 1000 for training. The labeled coefficients 1013 are a labeled set of coefficients that contain known desired and undesired feature coefficients. The learning architecture 1000 is comprised of an input layer 1014 with nodes 1 to N, a first hidden layer 1015 with nodes 1 to M, and an output layer 1018 with nodes 1 to P. Although only a total of three layers are illustrated, it should be understood that a plurality of hidden layers 1015, each with different (or even the same) number of nodes 1 to M may be implemented, depending on the application or the intended use of the learning architecture 1000.

The incoming set of labeled wavelet responses (wavelet coefficients) 1012 are transformed by the input layer 1014 nodes 1 to N by the functions or mathematical algorithms within these nodes. The type of functions within each node of any layer depends on the application or intended use of the learning architecture 1000. The nodes 1 to N may or may not have the same functions. For example, the node 1 of the input layer 1014 may simply contain a sink function and its node N a summation function. As illustrated, the output 1017 of each function within nodes 1 to N of the input layer 1014 is distributed to all of the nodes 1 to M of the next layer, which in this case is the hidden layer 1015. Like nodes 1 to N of input layer 1014, the nodes 1 to M of layer 1015 also contain functions or mathematical algorithms, which further transform the incoming, already transformed coefficients. The functionality of these nodes (1 to M of layer 1015) may be different from those in nodes 1 to N of layer 1014. Furthermore, the individual functionality of each node 1 to M may also differ with one another. The further transformed coefficients output from each node 1 to M is further distributed to all the nodes of the next subsequent layer, where they are further transformed, until they reach the output layer 1018, and output to a comparator 1006 of the training algorithm 1002.

As illustrated, at each stage (or layer), each function within each node 1 to N, or its result 1017 is also multiplied by a weight 1016, which are also known as multipliers. The weights 1016 are values assigned to coefficients, enabling the learning architecture 1000 to learn the importance of a particular coefficient or the resulting transformed coefficient. This allows a learned architecture to closely proximate desired feature wavelet coefficients. As illustrated by both dashed and solid lines, the weights may be combined either with the actual function within each node or with the resulting output 1017 of the function. The method of computing (or determining) the weights is considered the actual learning process for the neural network 1000, which is also known as the optimization process with respect to the application or intended use of the learning architecture 1000.

The training circuitry (or algorithm) 1002 is responsible for determining the weights to be applied to the functions or their resulting outputs (the transformed coefficients) 1017 of all the nodes of all layers in order to provide a good approximation of the types of coefficients the learning architecture 1000 should extract. As illustrated in FIG. 10A, the training algorithm 1002 determines and applies the appropriate weights 1016 to each node or its output 1017 based on the desired feature coefficients 1004. The data set 1004 are "study cases" from which the learning architecture 1000 learns to extract the "right" information from the incoming, previously known and labeled set of energy levels or feature coefficients 1013 during the learning mode. The desired feature coefficient data set 1004 contains only desired wavelet coefficients, and the set of labeled feature coefficients 1013 contain known desired and undesired coefficients.

The training algorithm 1002 teaches the learning architecture 1000 to learn about and look for the type of features in data 1004, and "separate" the known desired features from the known undesired ones in the data set 1013, during its learning mode. At the end of the first "run" or loop, the data 1012 transformed by all the node functions of the various layers is output at 1020 from the nodes 1 to P of the output layer 1018, and fed to a comparator 1006 of the training algorithm 1002. The comparator 1006 then determines the difference in the error in the first approximation in selecting the desired feature coefficients from the labeled test data 1013, compared to (or based on) the desired data set 1004. For example, if the first set of coefficients from the labeled set 1013 have 10 total desirable features that should have been extracted but in actual practice a lesser number of features were found, the comparator determines this difference and modifies the weights (described below) applied to each node or output thereof. The determined error (difference) from comparator 1006 is fed to a genetic register/Algorithm logic unit 1010 to adjust and fine tune the weights or multipliers, where they are set by the unit 1008 to later be combined with the functions of the nodes or their resulting outputs for a second iteration. The well-known genetic algorithm is one of many optimization techniques used in neural network.

As part of the training, it is desired to continually adjust and fine tune the weights iteratively, with each "run" in order to minimize the error detected by the comparator. After several iterations (or "runs" of the testing data 1004 and 1013), the learning architecture 1000 will eventually be able to closely select or extract the desired coefficients from the set of labeled data 1013, closely resembling the data set 1004 that contains only the desired data, within some tolerable error threshold level. Hence, the process of training is nothing more then determine the values for the weights that are multiplied by the coefficients, which are then used in the learned mode to extract desired wavelet coefficients representing desired features.

As illustrated in FIG. 10B, in the learned mode, the training circuitry (algorithm) unit 1002 is no longer needed. All the nodes of every layer contain all the functions and the correct weights to enable the neural network algorithm 1000 to determine, extract and classify the correct coefficients of any set of wavelet coefficients within a tolerable error rate. The features used to classify a set of incoming coefficients are based on the intended use or application of the entire system. For example, the feature could be the detection of a certain level of energy, represented by the wavelet coefficients. As stated in relations to FIG. 6A, the wavelet coefficients 618 represent energy, and hence, existence of a particular frequency component in a signal. The darkened tiles represent high energy level coefficients, and non-colored tiles represent coefficients with zero energy levels. The Feature Extractor and Classification Module 304 can classify the coefficients based on their energy level, and extract only those with high energy levels to represent a signal, and ignore the rest. This reduces the number of coefficients to be processed later by the Analog to Digital Converters 306. The reduced number of analog coefficients output from the Feature Extractor and Classification Module 304 improve the ADCs performance because the ADC no longer converts the entire analog coefficient, but only the selected few that have non-zero energy coefficient. Of course, the classified analog coefficient output at 1024 of the Feature Extractor and Classification Module 304 may be used in other analog devices or systems, if required.

Figure 11A:
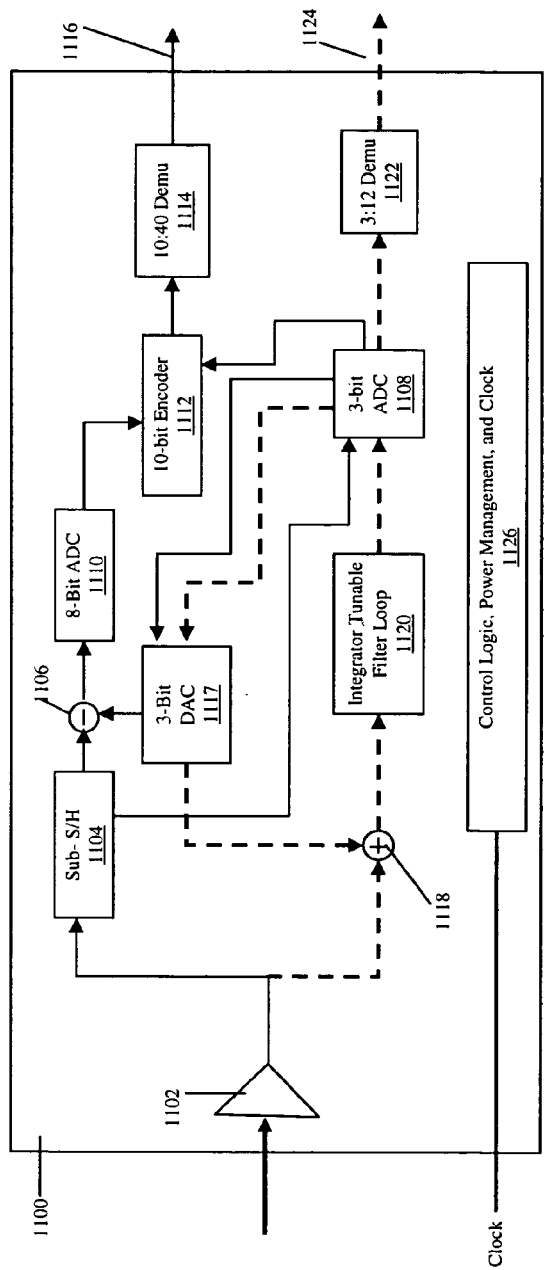
FIG. 11A is an exemplary illustration of a multi-bandwidth InP HBT ADC in accordance with the first embodiment of the present invention.
Figure 11B:
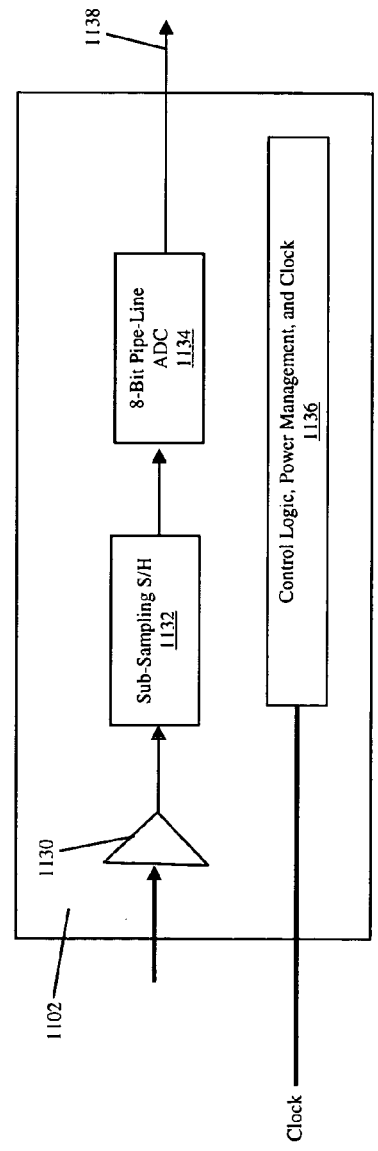
FIG. 11B is an exemplary illustration of a SiGe BiCMOS low power sub-sampling ADC in accordance with the first embodiment of the present invention.

(c) Analog-to-Digital Converter Module 306:

FIGS. 11A and 11B are two exemplary illustrations of three types of ADCs used in module 306 of FIG. 3A. As illustrated in FIG. 11A, the Intelligent, highly adaptable ADC sub-components incorporate a multifunction, multi-bandwidth ADC with a narrowband mode for fine frequency resolution consisting of an exemplary 3-bit 4 Gs/s delta-sigma ADC implemented with Tunable LC resonator enabling IF center frequency between exemplary 0.2 to 2 GHz, using a novel mismatch shaper for DAC 1117 in the feedback loop and a broadband mode with adaptable sampling rate, effective bit count, and power consumption, which is capable of up to an exemplary 2.5 Gs/s and an exemplary 10-bit operation. As illustrated in FIG. 11B, the intelligent, highly adaptable ADC sub-components also provide a low power, low sample rate, moderate resolution sub-sampling ADC with adaptive power control implemented in SiGe BiCMOS with as many as an exemplary 64 ADCs on a single chip. All three ADCs illustrated in both FIGS. 11A and 11B provide a front-end switchable logarithmic amplifier or variable gain amplifier.

Figure 13:
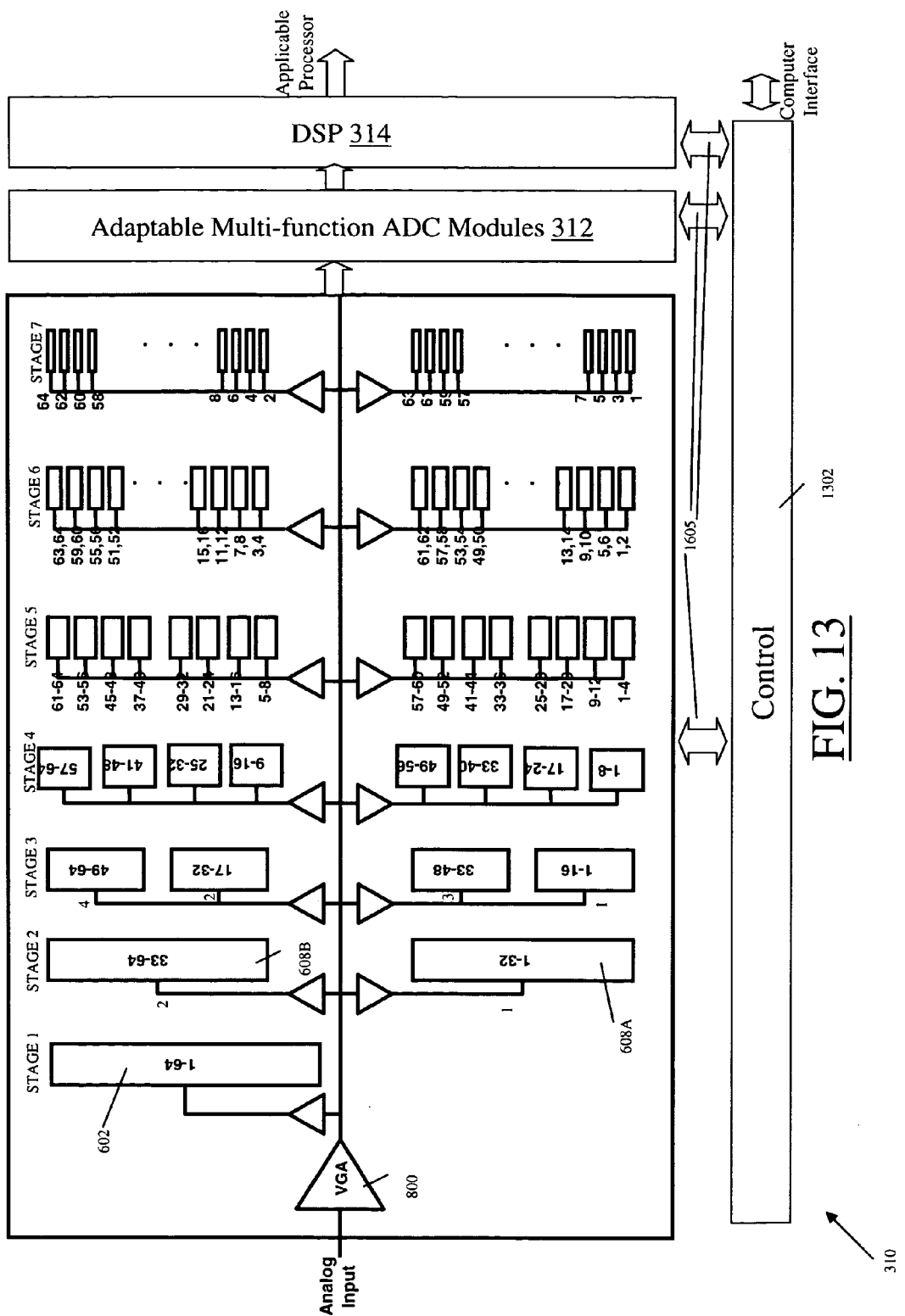
FIG. 13 is an exemplary specific implementation of a seven stage Adaptable Analog Decomposition Module illustrated in both FIGS. 3B and 6A, in accordance with the second embodiment of the present invention.

The adaptable ADC illustrated in FIG. 11A is able to switch between a 3-bit Flash ADC mode, 3-bit high resolution exemplary $4^{th}$ order bandpass delta-sigma mode, and a wideband multi-step pipelined 10-bit ADC mode. The high-speed 3-bit flash mode may operate up to an exemplary 4 Giga-Samples per second (GS/s) to handle the sub-band in Stage 1 (of FIG. 8). In the wideband multi-step pipelined exemplary 10-bit mode, the clock rate can be adjusted between an exemplary 4 GS/s down to an exemplary 250 MS/s with an exemplary 10 to 1 reduction in the DC power dissipation as the sample rate is reduced to handle sub-bands in Stages 2-4 of the filter bank tree (FIG. 13). The 3-bit ΔΣ ADC mode may clock at an exemplary 4 GS/s and have tunable loop filters and a novel tunable mismatched shaped feedback DAC 1117 that adaptively noise shapes the DAC errors out of the signal band. The loop filter 1120 is passive LC resonator based, for high dynamic range and is tunable and switch-able in ranges to cover the exemplary 1 GHz bandwidth.

The low-power sub-sampling SiGe BiCMOS ADC (FIG. 11B) can have a pipelined architecture with variable resolution between an exemplary 5-8 bits and a variable sample rate from an exemplary 128 MS/s to 32 MS/s. The DC power dissipation can also adapt with the sample rate over an exemplary 4 to 1 ranges.

The classified wavelet coefficients 1024 of the Feature Extractor and Classification Module 304 resulting from the outputs of the various channels of the Analog Transform Converter 302 are input to one of the three ADCs illustrated in FIG. 11A or 11B. The selection of the ADCs depends on bandwidth of the outputs (i.e. which channel of the Analog Transform Converter 302 they originated). Hence, the present invention uses three ADCs, the ΔΣ HDR NB, broadband, and sub-sampling low-powered ADCs to accommodate a variety of bandwidths signals. As an example, the wideband channel outputs (i.e. outputs from the 1-channel wavelet channelizer 602 of FIG. 6A), are fed to the broadband implementation illustrated FIG. 11A, which is a lower coarse implementation that handles broadband signals.

FIG. 11A illustrates the combination of two types of ADCs (broadband and delta-sigma High Dynamic Range (HDR) Narrow Band (NB)) into a single chip 1100. In FIG. 11A, the solid lines and the components that they are connected to constitute the broadband ADC, which is a high-speed, low resolution converter, and the dashed lines and the components that they are connected to constitute the ΔΣ HDR NB ADC. The classified analog wavelet coefficients from the Feature Extractor and Classification Module 304 are input to the unit 1100 through a Variable Gain Amplifier or a Log Amp 1102, which are amplified and then forwarded to various components within unit 1100 The logarithmic transfer characteristic optimizes the dynamic range at the input. The unit 1100 has both an 8-bit ADC fine quantizer 1110 used for the broadband signals, and a 3-bit ADC coarse quantizer 1108 used by both the broadband and the ΔΣ HDR NB ADCs. The feedback illustrated with both the dashed and the solid lines are used by the broadband and the ΔΣ HDR NB ADC to reduce noise signal by reshaping the noise component of the signal. The non-wideband signal output from the 3-bit ADC coarse quantizer 1108 is re-converted back to the analog domain by the shared 3-bit Digital to Analog Converter (ADC) 1117, and fed back through the Integrator Tunable Filter Loop 1120 via an adder unit 1118, both of which act as noise shapers to reduce signal noise, and reconverted to narrow band digital signal by the 3-bit ADC coarse quantizer 1108 for output by the ΔΣ HDR NB ADC. The output of the 3-bit DAC 1117 for the broadband ADC is fed to a subtractor unit 1106, and residual is requantized by the 8-bit ADC fine quantizer 110.

The sub-sampler sample-and-hold module 1104 samples the wideband amplified analog wavelet coefficients, and holds them until the initial quantization by the 8-bit ADC fine quantizer 1110 is performed. The output from the sub-sample sample-and-hold module 1104 is forwarded to a subtractor 1106 and the shared 3-bit ADC coarse quantizer 1108. The coarse quantizer 1108 determines the most significant 3 bits of the wideband signal and digitizes the signal. The 8-bit ADC fine quantizer 1110 determines the remaining (or the finer) 8 bits. The outputs of the coarse quantizer 1108 and the fine quantizer 1110 are fed to a 10-bit encoder 1112 (the combination of the two provides 10 bits excluding redundant 1 extra bit), and then to an exemplary 10:40 demultiplexer 1114 to slow down the data rate, and output 1116 to the Digital Signal Processor 308 illustrated in FIG. 3A as a broadband digital signal.

As for the ΔΣ HDR NB ADC represented by the dashed lines and the connected components on the same chip 1100, the classified wavelet coefficients are input to the delta-sigma ADC through the same Variable Gain Amplifier (VGA) or a Log Amp 1102, which are amplified and then forwarded to an adder 1118 and then passed through an Integrator Tunable Filter Loop 1120 and fed to the 3-bit ADC quantizer 1108. Integrator Tunable Filter Loop 1120 is passive LC resonator based, and is used for high dynamic range signals. One of the outputs of the 3-bit quantizer 1108 is fed back to the adder 1118 through a 3-bit DAC 1117, and the other output is fed to an exemplary 3:12 demodulator 1122 (to slow down the data rate) and output to the Digital Signal Processor 308 illustrated in FIG. 3A, as narrow band digital signal. The 3-bit DAC 1117 converts the signal back to analog domain, where upon passing through the adder unit 1118 and the Integrator Tunable Filter Loop 1120 the noise therefrom is reduced (reshaped) in the signal band. Module 1126 is the control, power management, and clock of the unit 1100.

The ADC illustrated in FIG. 11B is a sub-sampling Low-power ADC, where low bandwidth signals are input at the VGA or Log Amp 1130 at high frequency. The logarithmic transfer characteristic optimizes the dynamic range at the input. The signals are amplified, and then fed to the sub-sampling sample-and-hold (S/H) 1132. The sub-sampled signal is then converted using an 8-bit Pipeline ADC 1134 and output at 1138 to the Digital Signal Processor 308 illustrated in FIG. 3A. Module 1136 is the control, power management, and clock of the unit 1102. The clock frequency by which the sub-sampling sample-and-hold 1104 operates on the incoming signal is significantly below the Nyquist sampling rate.

Figure 12A:
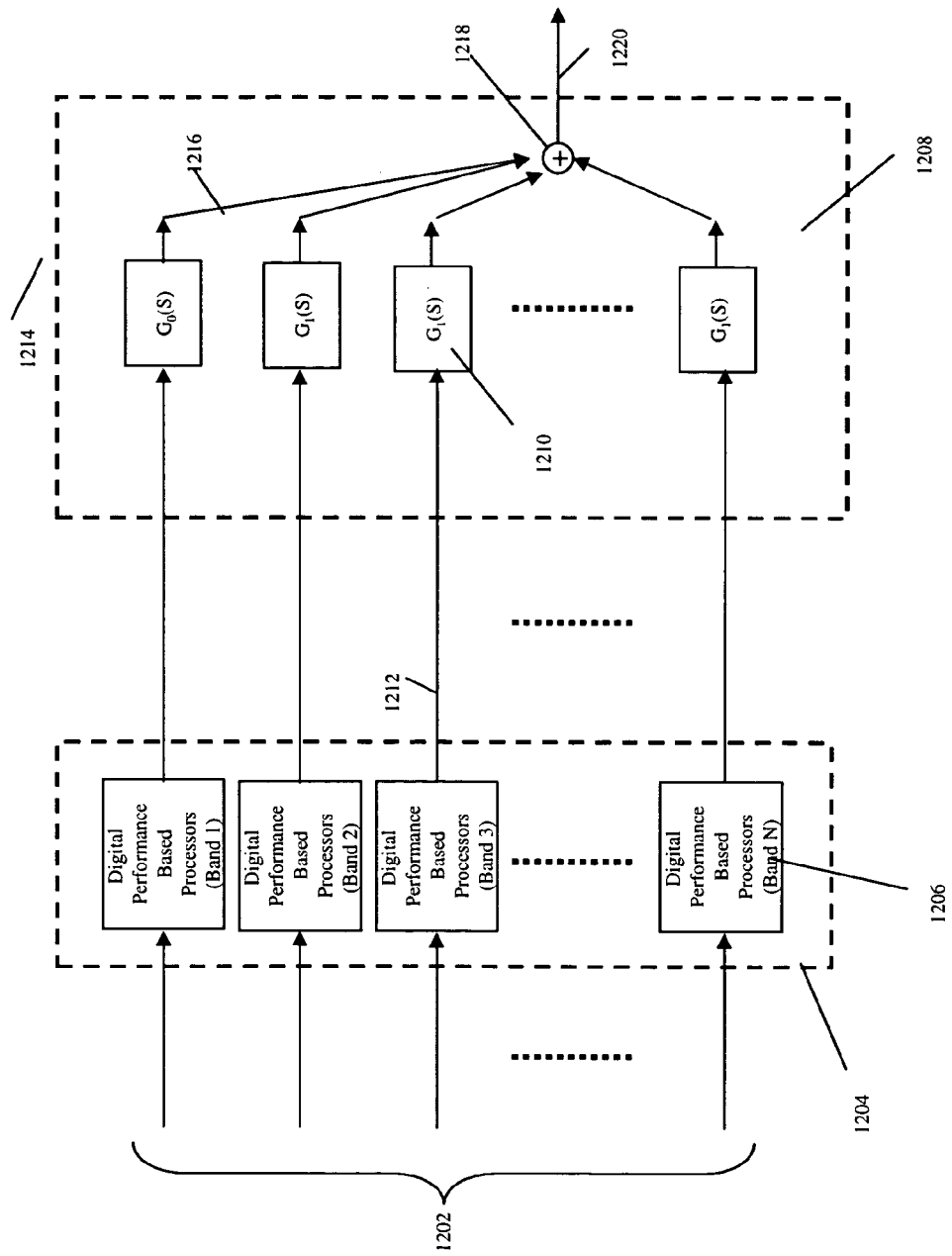
FIG. 12A is an exemplary illustration of a Digital Signal Processing for reconstruction of a signal in accordance with the first embodiment of the invention.
Figure 12B:
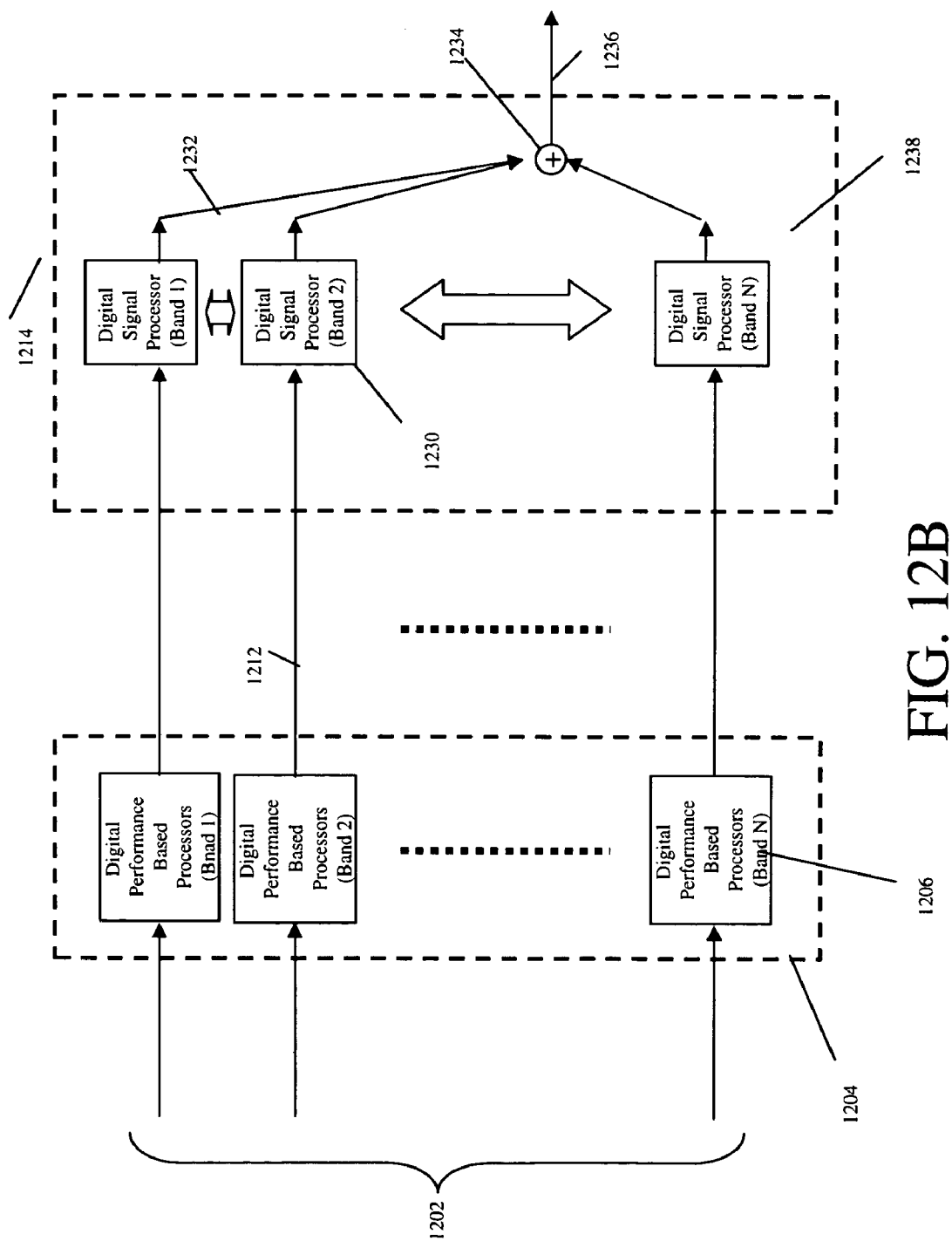
FIG. 12B is an exemplary illustration of a Digital Signal Processing for Target detection/recognition in accordance with the first embodiment of the invention.

(d) Digital Signal Processor Module 308:

FIGS. 12A and 12B are two exemplary illustrations of two types of Digital Signal Processing units used in the DSP module 308 of FIG. 3A. As illustrated, FIG. 12A is an exemplary high level block diagram of the Digital Signal Processing module 308, including a digital synthesis filter bank 1208 that enables recombining of incoming signals 1212 output from each Digital Performance Based Processor 1206. The signals 1212 are sub-bandwidths of the original signal, and need to be properly recombined in order to reconstruct the original signal at the output 1220. The act of recombining the signals requires upsampling of each signal 1202, which is done by digital performance based processors 1206, and the filtration of each signal 1202, using digitized wavelet filters 1210 whose transfer function match those of the analog wavelet filters 614 (illustrated first in FIG. 6A). Hence, the filters 1210 forming the digital synthesis filter bank 1208 are the digital version of the wavelet filters 614 in terms of their transfer functions. The output 1220 of the matched transfer digital filters 1210 generates the original wideband signal in digital domain. The digital performance based processors 1206 also function to compensate for hardware non-idealities, such as an imperfect matching between the transfer functions of the digital synthesis filters 1208 and the wavelet filters 614.

FIG. 12B is an exemplary high-level block diagram of transform based ADC system that uses the sub-band information directly for decision-making 1238, such as target recognition, and the estimation of interferer/jammer signal. The decision maker may be implemented as a classifier, such as a target recognition algorithm. In this case, the digital performance based processors 1206 may function as decoders, and the digital signal processors 1230 function to extract image features from each up converted bandwidth 1212. Although illustrated as separate units, both the Digital Performance Based Processor 1206 of both FIGS. 12A and 12B, and the digital synthesis filter bank 1208 or the decision-maker 1238 may be placed on a single digital signal processor. They are separated for clarity.

(II) Second Embodiment

This portion of the description focuses on the operation of each of the individual components of the second embodiment illustrated in the system overview shown in FIG. 3B. The relevant description of the remaining figures will be directed to only those components or functions that may differ from the first embodiment described above.

The overall operational concept and the disclosed architecture includes the analog pre-processing of a wideband signal, which is performed by splitting it into several smaller variable bandwidth sub-bands using a bank of filters such as wavelet filter bank which is similar to performing a sub-band decomposition (or the wavelet transform if wavelet filter bank is used) in the analog domain. The result of this is a set of variable number of coefficients at different bands with variable resolution, which could be quantized at different bit-rates, and amplitude resolutions. Just as the first embodiment, this second embodiment interprets this transformation as a projection of the input signal into the time-scale or time-frequency space, where the coefficients in each sub-band or time-frequency localized region (tile) contain the information of a signal in the analog domain. This transformed information of the analog signal is compressed by eliminating nonessential information. However, unlike the first embodiment, the non-essential information in this embodiment is determined by applying the information theoretic based measures—for example, entropy, inside an adaptable multi-function ADC module. This procedure eliminates most of the redundancy in the analog signal since the squares of the coefficients are directly related to the energy content of the signal in a particular localized sub-band (a localized time-frequency tile). The overall advantage of using an analog information theoretic based compression inside the adaptable multi-function ADC modules is to avoid digitizing non-essential information content of a signal (for example, extremely small coefficients) as is done in the current ADCs. For example, if the filter bank is designed properly, the output (coefficients) of the sub-band decomposition of "smooth" signals in high frequency sub-bands will have almost no nonzero values. The remaining essential information in each sub-band (non-zero values or non-zero wavelet coefficients) is quantized in a parallel fashion with parallel ADCs.

One can choose any type of parallel ADC—the particular choice is not essential for the overall ADC operation and performance. The digital representation of quantized coefficients in each sub-band is further processed based on the application dependent measures to generate feedback control signals to adaptively change the filter bank structure. For example, in automatic target detection (ATD) application, probability of false alarm can be used as a measure. The main goal in ATD is to minimize the probability of false alarm. Therefore, the minimization of probability of false alarm can be used as a feedback control to adaptively re-configure the filter bank structure. Once the optimum analog pre-processing is achieved, further digital processing can be performed in the transformed domain without reverting to signal domain.

The digital representation of quantized coefficients can be recombined if reverting to signal domain is needed via a digital FIR synthesis filter bank (for e.g., wavelet synthesis filter bank). One can interpret this transformation as a discrete inverse transform performed in the digital domain. In the disclosed adaptive, transform based ADC, this inverse transform is performed by digital filtering operation and implemented by a digital FIR filter bank. Further compression can be performed on the combined digital information since one may not have eliminated all the redundancy in the analog domain. For this also information theoretic measures based thresholding can be used.

(a) Adaptive Analog Decomposition Module 310:

The general overall concepts described above with respect to the Analog Transform Converter Module 302 of the first embodiment in relation to FIGS. 4, 5, 6A to 6B, 7A and 7B, and 9A to 9C are the same for this embodiment, with the exception of its implementation, which is illustrated in FIG. 13. FIG. 13 is one exemplary specific implementation of a seven stage Adaptive Analog Decomposition Module 310 illustrated in the system overview FIGS. 3B and 6A, in accordance with a second embodiment of the present invention. In the first embodiment illustrated in FIG. 8, the outputs were coupled to a Feature Extractor and Classification Module 304. With this embodiment, depending on the output stage, the outputs couple to specific types of Adaptable Multi-function ADC Modules 312. The analog pre-processing and transformation of wideband input signals (e.g. RF) are performed by the reconfigurable analog filter banks (channelizers) of the Adaptable Analog Decomposition Module 310 and the Adaptable Multi-function ADC Modules 312.

This example of a preferred implementation uses an exemplary 1 GHz instantaneous bandwidth although the architecture is scalable. In this example, seven stages of filtering with respect to bandwidths of filters are shown. In each stage the filters have the same bandwidths and their bandwidths double from one level to the next. The widest band is an exemplary 1024 MHz wide and the narrowest band is an exemplary 16 MHz wide. The filters are arranged into special architectures forming noncontiguous multiplexer pairs. This special arrangement eliminates the crossover frequency uncertainties commonly present in contiguous multiplexers.

The exemplary Adaptive Analog Decomposition Converter 310 illustrated includes a Variable Gain Amplifier 800, which amplifies the incoming analog signal to improve its signal-to-noise ratio. The signal is forwarded to all the channels (stages) for filtering. In this figure, the 1-channel wavelet channelizer 602 of FIG. 6A is represented at stage 1, the 2-channel wavelet channelizer 608 of FIG. 6A is represented at stage 2, and so on. As illustrated, the multi-channel wavelet channelizers are physically split to eliminate crossover frequency uncertainties. For example, the 2-channel wavelet channelizer 608 of FIG. 6A is split into two "channelizer" 608A and 608B when implemented.

With this embodiment, each filter output of the Adaptable Analog Decomposition Module 310 is coupled to an energy monitor or power detector 1400 (illustrated in FIG. 14A to 14C) of one of the three types of the Adaptable Multi-function ADC Modules 312. A "flag" signal 1605 is sent to the system controller (in general, the Adaptable Adaptable Digital Signal Processing Module 314 described below) through the control unit 1302 when energy is present in any one of the bands (stages). These "flag" signals 1605 will also be used to turn on and off the subsequent ADCs 1404/1406 (illustrated in FIGS. 14A to 14C, and 15A and 15B) within the Adaptable Multi-function ADC Modules 312, and will help to reconfigure the analog filters in the Adaptive Analog Decomposition Module 310. The goal of this adaptive process is to minimize the number of channels for which the ADCs 1404/1406 needs to be turned on. This transform based ADC example can implement any combination of wavelet, wavelet packet, and Fourier transforms ranging from the simplest dyadic wavelet transform (6 ADCs required) to a straight Short-Time-Fourier transform at the lowest level (64 ADCs required).

Figure 14A:
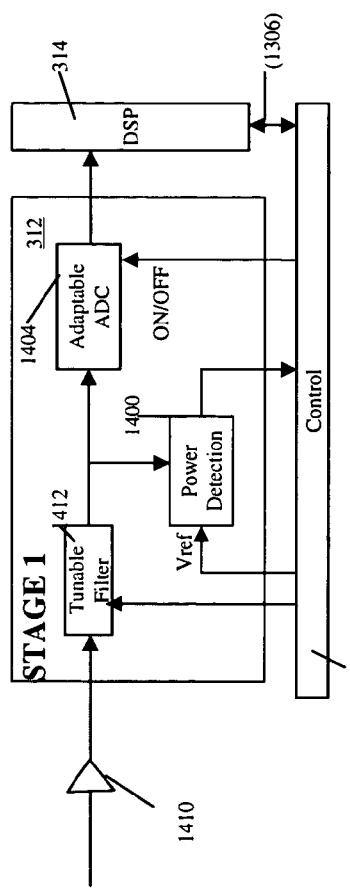
FIGS. 14A to 14C are exemplary illustrations of Adaptable Multi-function ADC modules in accordance with the second embodiment of the present invention.
Figure 14C:
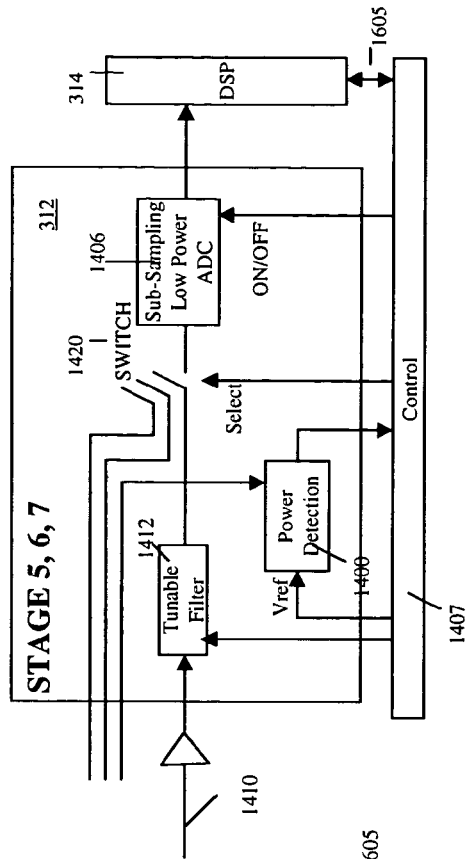
Figure 14B:
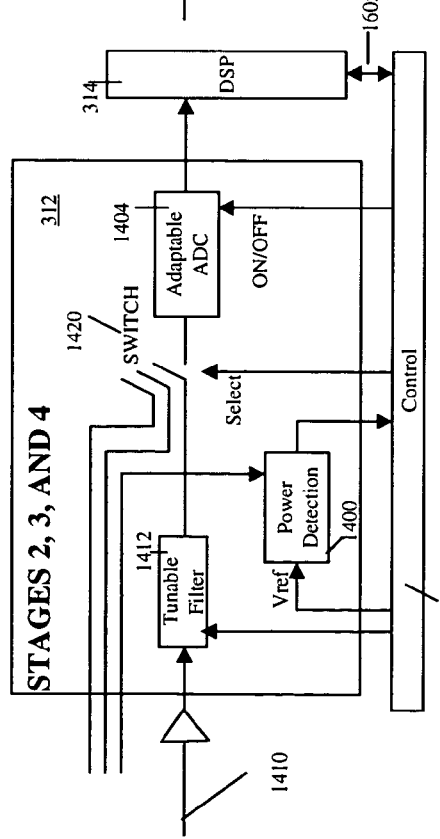

(b) Adaptable Multi-function ADC Modules 312:

FIGS. 14A to 14C are exemplary illustrations for three types of Adaptable Multi-function ADC Modules 312 that may be used with the seven stage implementation of the Adaptive Analog Decomposition Module 310, illustrated in FIG. 13. As illustrated, all of the Adaptable Multi-function ADC Modules 312 in FIGS. 14A to 14C comprise of a Tunable Filter 1412, which is tuned to different bandwidth of the channels of each stage within the Adaptable Analog Decomposition Module 310. As an example, the Tunable Filter 1412 of Adaptable Multi-function ADC Modules 312 illustrated in FIG. 14A may be tuned to the frequency response of stage 1 wavelet filters, the Tunable Filter 1412 illustrated in FIG. 14B may be tuned to any of the frequency responses of stages 2, 3, and 4 wavelet filters, and the Tunable Filter 1412 of FIG. 14C may be tuned to the frequency responses of stages 5, 6, and 7 wavelet filters, all switched and controlled by the Adaptable Digital Signal Processing Module 314. This enables the sharing of the Adaptable Multi-function ADC Modules 312 among the various stages of the Adaptable Analog Decomposition Module 310. The number of stages sharing an Adaptable Multi-function ADC Module 312 is not limited to a maximum of three as illustrated, but may vary depending on application and intended use of the system.

FIGS. 14A to 14C also illustrate the mechanism that enables the Adaptable Multi-function ADC Modules 312 to be shared across the sub-bands (stages) of the Adaptable Analog Decomposition Module 310. Specifically, eight Adaptable Multi-function ADC Modules 312 (FIG. 14B) are shared by the sub-bands in Stages 2-4 (14 sub-bands). Each Adaptable Multi-function ADC Modules 312 (in both FIGS. 14B and 14C) has an exemplary three electronically switchable inputs 1420 to direct its position in the filter bank tree of FIG. 13. Of course, increasing the number of stages that share the Adaptable Multi-function ADC Module 312 would require an increase in the number of electronically switchable inputs 1420. Stages 5-7 will use 64 low power subsampling ADCs 1406 (Adaptable Multi-function ADC Modules 312 of FIG. 14C) with 3 electronically switch-able inputs 1420 (per ADC) to cover an exemplary 112 sub-bands from an exemplary 64 MHz to 16 MHz bandwidth channels. The purpose of sharing the Adaptable Multi-function ADC Modules 312 among the sub-band is to minimize the number of ADC 1404/1406 needed. The switches 1420 are included as part of the input to the ADC 1404/1406 of the Adaptable Multi-function ADC Modules 312. As mentioned above, the Adaptable Multi-function ADC Modules 312 of FIG. 14A requires no switch because it is associated with only stage 1 of the Adaptive Analog Decomposition Module 310.

As further illustrated in FIGS. 14A to 14C, the feature that triggers the above switching action is the adaptable power detection unit 1400, which is included in all of the Adaptable Multi-function ADC Modules 312. If there is no energy (wavelet coefficients) in the sub-bands of the Adaptive Analog Decomposition Module 310 that share the Adaptable Multi-function ADC modules 312, the DC power to that module's ADC 1404/1406 will turn off. With this embodiment, the power is used as the "feature" by which the various stages of the Adaptive Analog Decomposition Module 310 are selected (or switched online). The power detection signals and the resulting switching action are controlled by the Adaptable Digital Signal Processing Module 314, and its feedback signal 1605 (illustrated in FIGS. 16A and 16B). The input stage 1410 at each adaptable multi-function ADC module will have variable gain capability and may switch to a logarithmic transfer characteristic to optimize the dynamic range at the input.

The details of each of the ADCs 1404 and 1406 of the Adaptable Multi-function ADC Module 312 are illustrated in FIGS. 15A and 15B. The ADCs of this second embodiment illustrated in FIGS. 15A and 15B are identical to those illustrated in FIGS. 11A and 11B, with exception of the added N-bit Digital-to-Analog Converter (DAC) 1502, and the feedback signals 1605 of the Adaptable Digital Signal Processing Module 314. If a jammer or strong interfering signal is stationary and can be estimated by the Digital Signal Processor (ADSP) 314, a cancellation signal 1605 is provided via the Digital to Analog (DAC) 1502 at the input to each ADC to cancel the strong interfering signal. The adaptable ADC illustrated in FIG. 15A is able to switch between a 3-bit Flash ADC mode, 3-bit high resolution exemplary $4^{th}$ order bandpass delta-sigma mode, and a wideband multi-step pipelined 10-bit ADC mode. The high-speed 3-bit flash mode may operate up to an exemplary 4 Giga-Samples per second (GS/s) to handle the sub-band in Stage 1 (of FIG. 13). In the wideband multi-step pipelined exemplary 10-bit mode, the clock rate can be adjusted between an exemplary 2 GS/s down to an exemplary 250 MS/s with an exemplary 10 to 1 reduction in the DC power dissipation as the sample rate is reduced to handle sub-bands in Stages 2-4 of the filter bank tree (FIG. 13). The 3-bit ΔΣ ADC mode may clock at an exemplary 4 GS/s and have tunable loop filters and a novel tunable mismatched shaped feedback DAC 1117 that adaptively noise shapes the DAC errors out of the signal band. The loop filter 1120 is passive LC resonator based, for high dynamic range and is tunable and switch-able in ranges to cover the exemplary 1 GHz bandwidth. The 3-bit ΔΣ ADC mode can be capable of 16-bit ENOB in an exemplary 10 MHz bandwidth for the case when a large signal is in the same narrow band channel as the signal of interest and the cancellation DAC 1502 can not remove the interfere. If any of the partial resources of the Adaptable Multi-function ADC Modules 312 are not in use, their DC power will be turned off by the controller 1126. The low-power sub-sampling SiGe BiCMOS ADC (FIG. 15B) can have a pipelined architecture with variable resolution between an exemplary 5-8 bits and a variable sample rate from an exemplary 128 MS/s to 32 MS/s, which inputs up to 2 GHz. The DC power dissipation can also adapt with the sample rate over an exemplary 4 to 1 ranges.

Figure 16A:
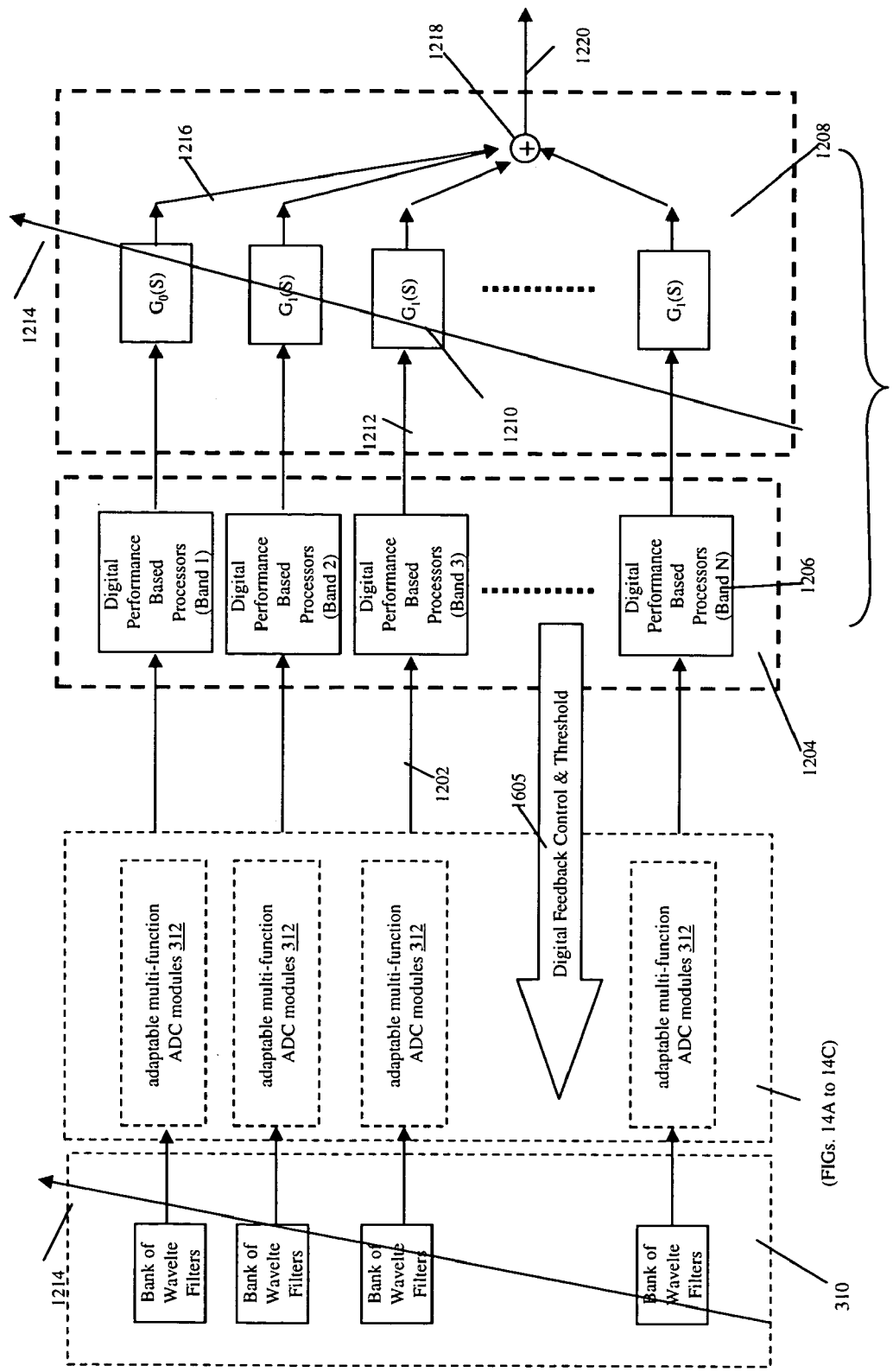
FIG. 16A is an exemplary illustration of a Digital Signal Processing for reconstruction of a signal in accordance with the second embodiment of the invention.
Figure 16B:
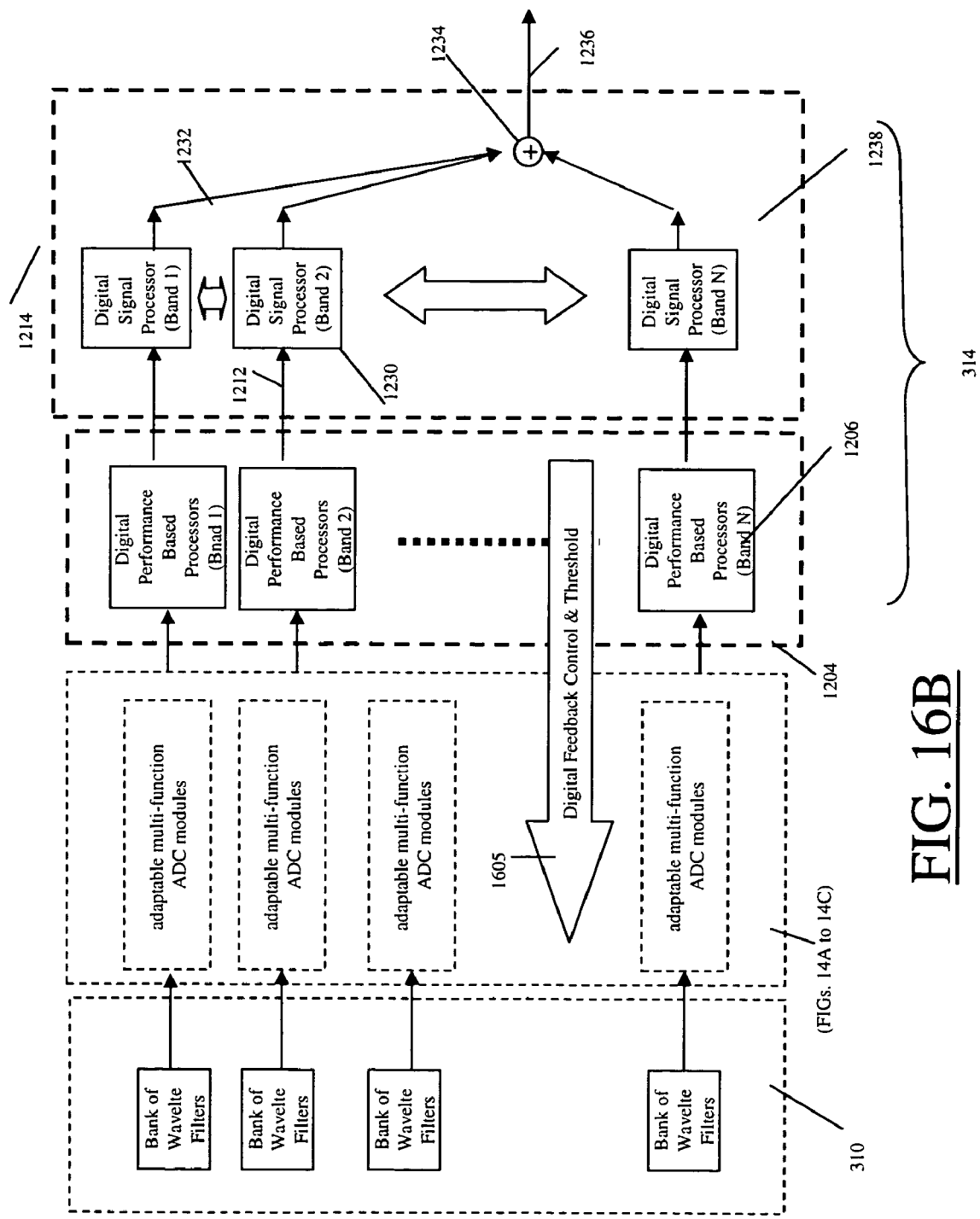
FIG. 16B is an exemplary illustration of a Digital Signal Processing for Target detection/recognition in accordance with the second embodiment of the invention.

(c) Adaptable Digital Signal Processor Module 314:

FIGS. 16A and 16B are exemplary illustrations of the Adaptable Digital Signal Processing Modules 314 for the second embodiment. For the selection of required information using an information theoretic measure a performance based digital processor 1206 shown in FIGS. 16A and 16B is used. These processors compute the information theoretic measure such as entropy from the transformed and sampled signal and use this to set a threshold value which is fed back 1605 to the thresholder that is shown in these two figures after the sampler. A thresholder could be implemented as a comparator. Thresholding before quantization is novel and non-traditional. This has a significant advantage of reducing noise effects in ADC since small coefficients from the Adaptive Analog Decomposition Module 310 are not quantized.

An algorithm to generate performance based feedback control signal 1605 is also implemented using a digital processor for each sub-band as shown in FIGS. 16A and 16B. These generations of control signal 1605 is dependent on the application. For example, if the application is low probability false alarm automatic target detection (FIG. 16B), then the probability of false alarm is computed from the features that are extracted from the digitized signal and a control signal is generated to re-configure the analysis filter structure till required probability of false is obtained. The re-configurations of the analysis filters correspond to changing the bandwidth, filter order, etc.

If this architecture is going to be used for decision making without reverting back to the signal domain (FIG. 16B), then further processing can be performed on another set of digital processors 1230 and information from each band is fused 1234 and the final decision is outputted at 1236 as shown in FIG. 16B. If this architecture is going to be used for the generation of digital output 1220 then a digital FIR synthesis filter bank 1608 recombines the digital outputs 1218 from the individual sub-bands 1210 into a high data rate output digital bit stream 1220 as shown in FIG. 16A. This digital filter bank 1608 is designed with the constraint of perfect reconstruction i.e., matching its transfer function with the transfer function of the analog analysis filter bank in the Adaptive Analog Decomposition Module 310. For these two filter banks, any technology can be used. However, if wavelet technology is used it is more beneficial in terms of optimum sub-band decomposition and in terms of designing matching analysis and synthesis filter banks and, correction and prediction filters. As indicated by the arrow 1614 across the filter bank 1608, the transfer functions of these digital filters 1610 may be varied commensurate with the variable transfer functions of the Adaptive Analog Decomposition Module 310.

Therefore, in the second embodiment the transform based ADC system provides the optimum and sparse representation of analog signals in the transformed domain (e.g. wavelet packet domain) using a bank of wavelet analog filter bank, which is adaptively reconfigurable. It also removes interfere or jamming signals in selected branches of the wavelet packet tree by estimating it using coarse wavelet packet representation and synthesizing a cancellation signal feedback to the ADC input through a DAC on the ADC chip. The thresholding method allows for selection of ADCs to digitize required wavelet packet coefficients.

The performance based control algorithms of the DSPs allow (a) to control the threshold level that selects the ADCs (b) to control the center frequency and band width of analog filter bank and levels of wavelet packet decomposition. The performance based control algorithms also allow for the generation of decisions (e.g., features or target identification) by digitally processing the quantized coefficients in each sub-band.

The second embodiment further provides the generation of digitized samples of the analog signal by applying the inverse wavelet packet decomposition using digital synthesis finite impulse response (FIR) based filter bank, and mitigates RF interference by the use of sub-bands (intermodulation products from strong interferes fall out side of individual sub-bands and are removed by filtering), limiting the strong interferes at the input to the ADCs in the sub-bands where strong interferes are present, increasing the gain under digital control at the inputs to the ADC sub-band where strong interferes are not present, and recombining the ADC sub-bands in the digital synthesis filter free of intermodulation product from the strong interferes with the signal of interest enhanced relative to the interfering signals.

The second embodiment also provides reconfigurable miniature filter bank that incorporates reconfigurable miniature wide bandwidth lumped element passive diplexers that allow rapid reconfiguration of filter transfer functions corresponding to various wavelet bases and transforms. The transfer functions of these novel diplexers will be the modified Butterworth, Chebyshev, Elliptic and Gaussian types with the capability of adaptively changing them for the same filter. The miniature reconfigurable narrow bandwidth passive Lead Zirconate Titanate (PZT) Bulk Acoustic Wave (BAW) diplexers allow rapid reconfiguration of filter transfer functions corresponding to various wavelet bases and transforms. The miniature exemplary 127-element passive tree-structured adaptive diplexer bank performs flexible analog pre-processing of input signal, i.e., general time-frequency tiling, such as the wavelet, wavelet packet and Fourier transforms.

(6) Results

The present invention therefore provides an intelligent adaptive use of available resolution-speed product, and a highly efficient digitization process in terms of (a) application dependent adaptive digitization, (b) minimization of information redundancy in the analog signal that is being digitized, (c) information conditioning of analog signal before digitization and (d) optimal utilization of limited power available for ADC process.

The present invention could provide innovative solutions that are needed to overcome the present resolution-speed product limit and thus would be useful for applications such as (a) improved target detection, (b) real-time high resolution mapping, (c) extended radar range for air-to-air targets, (d) advanced multifunction RF operations and wideband RF surveillance; and, commercial applications such as (a) high resolution digital cinema and (b) wide bandwidth optical satellite link.

In short, the main advantages of the disclosed novel architectures are: (a) the analog pre-processing using a filter bank that corresponds to variable band-width sub-band decomposition of a wideband signal, (b) the removal of non-essential information of a signal in each sub-band using information theoretic measures or neural network learning architecture, (c) the use of correction filters to take care of circuit non-idealities, (d) the use of feedback (second embodiment) from the performance based digital pre-processor to re-configure the analog pre-processing, (e) further application dependent digital processing in the sub-band domains for improved decisions such as Automatic Target Detection (ATD) with low probability of false alarm without reverting back to the signal domain, (f) the generation of high data rate, non-redundant digital output data stream if needed by combining the output from each sub-band using a synthesis digital filter bank which is designed such that it is matched with the analysis filter bank and (g) the flexible and intelligent ADC architecture that can handle both highly dynamically varying and slowly varying signals with or without the presence of noise.

Although the invention has been described in language specific to structural features and or methodological steps, it is to be understood that the invention defined in the appended claims is not necessarily limited to the specific features or steps described. Rather, the specific features and steps are disclosed as preferred forms of implementing the claimed invention.

What is claimed is:

1. An adaptive, intelligent, transform-based, analog to information converter system comprising:
   an analog transform converter module for receiving an analog signal including information and for decomposing the analog signal into a plurality of sub bands; and
   a feature extraction and classification module coupled with the analog transform converter module for receiving the sub bands from the analog transform converter module and for performing a classification operation for determining analog signal portions corresponding to at least one transmitted analog signal portion and an interference analog signal portion, and increasing the feature-to-noise ratio of the analog signal to maximize the fidelity of the transmitted analog signal portion to generate an improved-fidelity representation of the analog signal;
   a sampling module coupled with the analog transform converter module and the feature extraction and classification module to receive the sub bands from the analog transform converter module and to sample each of the plurality of sub bands to produce sampled sub bands, where at least one of the plurality of sub bands is sampled using a sampling rate different from a sampling rate used to sample another of the plurality of sub bands, and to provide the sampled sub bands to the feature extraction and classification module;
   with the feature extraction and classification module further comprises a combinatorial selection module for receiving the sampled sub bands and combining sets of sampled sub bands to generate different transform optimally for a given signal.

2. An adaptive, intelligent, transform-based, analog to information converter system as set forth in claim 1, further comprising an adaptable analog-to-digital converters coupled with the feature extraction and classification module for receiving the improved-fidelity representation of the analog signal and for converting the improved-fidelity representation of the analog signal to a digital representation of the analog signal.

3. An adaptive, intelligent, transform-based, analog to information converter system as set forth in claim 2, further comprising a digital signal processor coupled with the adaptable analog-to-digital converters for receiving the digital representation of the analog signal and for further processing the digital representation of the analog signal.

4. An adaptive, intelligent, transform-based, analog to information converter system as set forth in claim 3, wherein the analog transform converter module comprises a set of n-channelizers, with each channelizer having a bank of filters, where each channelizer receives the analog input signal and wherein the bank of filters in each channelizer operates to decompose the analog input signal into a set of subbands.

5. An adaptive, intelligent, transform-based, analog to information converter system as set forth in claim 4, wherein filters of the channelizers are wavelet filters, wherein a transfer function of the wavelet filter is a wavelet.

6. An adaptive, intelligent, transform-based, analog to information converter system as set forth in claim 5, wherein each wavelet filter comprises a set of electromagnetic resonators coupled such that a transform function of the set of electromagnetic resonators corresponds to the wavelet.

7. An adaptive, intelligent, transform-based, analog to information converter system as set forth in claim 6, wherein the sampling module samples outputs of the wavelet filters, generating a set of sampled wavelet coefficients where the wavelet coefficients represent energy levels that correspond to frequency bands of a received signal over a time interval.

8. An adaptive, intelligent, transform-based, analog to information converter system as set forth in claim 7, wherein the set of n-channelizers forms a dyadic tree structure of banks of wavelet filters, and wherein combinations of wavelet coefficients are selected by the combinatorial selection module to generate different transforms.

9. An adaptive, intelligent, transform-based, analog to information converter system as set forth in claim 8, wherein the adaptable analog-to-digital converters are multi-bandwidth analog-to-digital converters.

10. An adaptive, intelligent, transform-based, analog to information converter system as set forth in claim 9, wherein the multi-bandwidth analog-to-digital converters are comprised of a broadband and a $\Delta\Sigma$ High Dynamic Range Narrow Band converters.

11. An adaptive, intelligent, transform-based, analog to information converter system as set forth in claim 10, wherein the multi-bandwidth analog-to-digital converters share a Digital-to-Analog converter, and a first quantizer unit.

12. An adaptive, intelligent, transform-based, analog to information converter system as set forth in claim 11, wherein the adaptable analog-to-digital converters comprise of low-power sub-sampling Analog-to-Digital converters, and are implemented in SiGe BiCMOS.

13. An adaptive, intelligent, transform-based, analog to information converter system as set forth in claim 12, wherein the further processing of the digitized improved-fidelity signal includes a synthesis digital wavelet filter bank for reconstruction of the original signal in a digital domain.

14. An adaptive, intelligent, transform-based, analog to information converter system as set forth in claim 13, wherein the further processing of the digitized improved-fidelity signal includes a set of processors for decision making, without reverting to the analog domain.

15. An adaptive, intelligent, transform-based, analog to information converter system as set forth in claim 1, further comprising a digital signal processor coupled with an adaptable analog-to-digital converter for receiving a digital representation of the analog signal and for further processing a digital representation of the analog signal.

16. An adaptive, intelligent, transform-based, analog to information converter system comprising:
   an adaptive analog decomposition block for receiving a signal including information and having a signal size and for decomposing the signal into a plurality of subbands;
   an adaptive digitizer block for receiving the subbands from the adaptive analog decomposition block and removing undesired information from the signal resulting in a compacted signal having a smaller signal size; and
   a performance evaluation processor for evaluating the performance of at least one of the adaptive analog decomposition block and the adaptive digitizer and for providing a control signal for adjusting the at least one of the adaptive analog decomposition block and the adaptive digitizer to minimize the size of the compacted signal; whereby the adaptive analog to information converter system generates a compacted signal representing the essence of the information in the original signal.

17. An adaptive, intelligent, transform-based, analog to information converter system as set forth in claim 16, wherein the adaptive digitizer block further comprises at least one of an adjustable-rate sampler having a sampling rate and a thresholder having a plurality of levels, and wherein the performance evaluation processor provides a digitizer control signal for adjusting at least one of the sampling rate and the plurality of levels, whereby the resolution of the adaptive digitizer block may be adjusted to minimize the size of the compacted signal.

18. An adaptive, intelligent, transform-based, analog to information converter system as set forth in claim 16, wherein the performance evaluation processor provides a decomposition control signal to adjust at least one of (a) the individual subbands and (b) the number of subbands into which the signal is decomposed by the adaptive analog decomposition block.

19. An adaptive, intelligent, transform-based, analog to information converter system as set forth in claim 16, wherein the adaptive digitizer block further comprises a correction filter for adjusting for discrepancies between the adaptive analog decomposition block and the digital performance evaluation processor.

20. An adaptive, intelligent, transform-based, analog to information converter system as set forth in claim 16, further comprising an output from at least one of the adaptive digitizer block and the performance evaluation processor for providing the compacted signal for further information processing.

21. An adaptive, intelligent, transform-based, analog to information converter system as set forth in claim 16, wherein the performance evaluation processor is incorporated with an information processor for further processing the compacted signal.

22. An adaptive, intelligent, transform-based, analog to information converter system as set forth in claim 21, wherein the digital signal processor is a decision support processor which receives the compacted signal and generates a decision based on the compacted signal.

23. An adaptive, intelligent, transform-based, analog to information converter system, as set forth in claim 17, further comprising an output from at least one of the adaptive digitizer block and the performance evaluation processor for providing the compacted signal for synthesis by an adaptive digital synthesis block for combining the subbands to construct an output signal, wherein the performance evaluation processor provides a control signal for adjusting the adaptive digital synthesis block for properly synthesizing the subbands.

24. An adaptive, intelligent, transform-based, analog to information converter system as set forth in claim 16, wherein the performance evaluation processor is incorporated with an adaptive digital synthesis block for further constructing an output signal from the subbands, wherein the performance evaluation processor provides a control signal for adjusting the adaptive digital synthesis block for properly synthesizing the subbands.

25. An adaptive, intelligent, transform-based, analog to information converter computer program product comprising means, encoded on a computer-readable medium, for:

receiving a signal including information having a signal size;

decomposing the signal into a plurality of sub bands;

removing undesired information from the signal resulting in a compacted signal having a smaller signal size; and evaluating the performance of at least one of the act of decomposing the signal and the act of removing undesired information from the signal and providing a control signal for adjusting the at least one the act of decomposing the signal and the act of removing undesired information from the signal to minimize the size of the compacted signal; whereby the adaptive analog to information converter method generates a compacted signal representing the essence of the information in the original signal.

26. A method for adaptive, intelligent, transform-based, analog to information conversion comprising the acts of:

receiving an analog signal, which includes information;

decomposing the analog signal into a plurality of sub bands;

classifying the plurality of subands for determining analog signal portions corresponding to at least one transmitted analog signal portion and an interference analog signal portion, and increasing the feature-to-noise ratio of the analog signal to maximize a fidelity of the transmitted analog signal portion to generate an improved-fidelity representation of the analog signal;

wherein the act of classifying further comprises: receiving sets of sampled sub bands;

combinatorial selecting and combining the received sets of sampled sub bands to generate different transform optimally for a given signal.

27. A method for adaptive, intelligent, transform-based, analog to information conversion as set forth in claim 26, further comprising the acts of:

sampling each of the plurality of sub bands to produce sampled sub bands, where at least one of the plurality of sub bands is sampled using a sampling rate different from a sampling rate used to sample another of the plurality of sub bands.

28. A method for adaptive, intelligent, transform-based, analog to information conversion as set forth in claim 26, further comprising the acts of:

receiving the improved-fidelity representation of the analog signal; and converting the improved-fidelity representation of the analog signal to a digital representation of the analog signal.

29. A method for adaptive, intelligent, transform-based, analog to information conversion as set forth in claim 26, further comprising the acts of:

receiving a digital representation of the analog signal; and processing the digital representation of the analog signal.

30. A method for adaptive, intelligent, transform-based, analog to information conversion as set forth in claim 26, further comprising the acts of:

generating a set of wavelet coefficients where the wavelet coefficients represent energy levels that correspond to frequency bands of a received signal over a time interval, where the value each wavelet coefficient represent a tile value.

* * * * *